US012727196B2

(12) United States Patent
Van Dal et al.

(10) Patent No.: US 12,727,196 B2
(45) Date of Patent: Sep. 1, 2026

(54) METHOD FOR MANUFACTURING SEMICONDUCTOR STRUCTURE WITH THIN FILM TRANSISTOR

(71) Applicant: TAIWAN SEMICONDUCTOR MANUFACTURING COMPANY, LTD., Hsinchu (TW)

(72) Inventors: Marcus Johannes Henricus Van Dal, Linden (BE); Gerben Doornbos, Kessel-Lo (BE); Georgios Vellianitis, Heverlee (BE); Mauricio Manfrini, Zhubei City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/477,068

(22) Filed: Sep. 28, 2023

(65) Prior Publication Data

US 2024/0038893 A1 Feb. 1, 2024

Related U.S. Application Data

(62) Division of application No. 17/466,148, filed on Sep. 3, 2021, now Pat. No. 12,230,716.

(Continued)

(51) Int. Cl.

*H10D 30/67* (2025.01)
*H10B 61/00* (2023.01)

(Continued)

(52) U.S. Cl.

CPC ......... *H10D 30/6713* (2025.01); *H10B 61/22* (2023.02); *H10B 63/30* (2023.02);

(Continued)

(58) Field of Classification Search

CPC .. H10D 30/6755; H10D 99/00; H10D 84/013; H10D 84/0149; H10P 14/3434; H10P 30/202

See application file for complete search history.

(56) References Cited

U.S. PATENT DOCUMENTS

| | | | |
|---|---|---|---|
| 9,608,126 | B1 | 3/2017 | Hsu et al. |
| 10,008,614 | B1 | 6/2018 | He et al. |

(Continued)

FOREIGN PATENT DOCUMENTS

| | | | |
|---|---|---|---|
| TW | 202005053 | A | 1/2020 |
| WO | WO2019/005094 | A1 | 1/2019 |

OTHER PUBLICATIONS

U.S. Office Action for U.S. Appl. No. 17/466,148, dated Oct. 30, 2023.

(Continued)

*Primary Examiner* — Vincent Wall

(74) *Attorney, Agent, or Firm* — Birch, Stewart, Kolasch & Birch, LLP

(57) ABSTRACT

Semiconductor structures and methods for manufacturing the same are provided. The method for manufacturing the semiconductor structure includes forming a bottom electrode layer over a substrate and forming a gate dielectric layer over the bottom electrode layer. The method for manufacturing the semiconductor structure also includes forming an active layer over the gate dielectric layer and forming an indium-containing feature vertically overlapping the bottom electrode layer. The method for manufacturing the semiconductor structure also includes forming a source/drain contact landing on the indium-containing feature.

20 Claims, 19 Drawing Sheets

Related U.S. Application Data

(60) Provisional application No. 63/195,895, filed on Jun. 2, 2021.

(51) Int. Cl.
*H10B 63/00* (2023.01)
*H10D 62/80* (2025.01)
*H10D 99/00* (2025.01)
*H10P 14/20* (2026.01)
*H10P 30/20* (2026.01)

(52) U.S. Cl.
CPC ......... *H10D 30/6755* (2025.01); *H10D 62/80* (2025.01); *H10D 99/00* (2025.01); *H10P 14/3434* (2026.01); *H10P 30/202* (2026.01)

(56) References Cited

U.S. PATENT DOCUMENTS 11,404,586 B1* 8/2022 Dai ........................ H10D 99/00
2007/0158632 A1* 7/2007 Ho ........................ H10N 70/063 430/313
2012/0193697 A1* 8/2012 Takemura ............ H10B 12/315 257/306
2012/0298986 A1* 11/2012 Inoue ................... H10D 86/423 257/E21.409
2014/0042539 A1* 2/2014 Hwang ............. H01L 29/66969 438/162
2015/0021596 A1* 1/2015 Yamazaki ............ H10D 86/423 257/43
2015/0084021 A1* 3/2015 Nakano ............. H01L 29/78618 257/43
2015/0249156 A1* 9/2015 Ohguro ............. H01L 29/78618 257/43
2016/0268382 A1* 9/2016 Colinge ............... H10D 84/038
2017/0040424 A1* 2/2017 Tanaka ..................... H10D 1/00
2017/0092771 A1 3/2017 Hsu et al.
2017/0141131 A1* 5/2017 Nakano ............... H01L 27/1248
2017/0170326 A1* 6/2017 Tsubuku ................ H10D 86/60
2017/0236842 A1 8/2017 Matsuda et al.
2017/0288061 A1* 10/2017 Sasaki .................. H10D 30/021
2018/0033891 A1* 2/2018 Pu ........................ H10D 30/673
2018/0166392 A1* 6/2018 Yamazaki .............. H10D 88/00
2019/0109199 A1 4/2019 Yao et al.
2020/0159083 A1* 5/2020 Beales .................. G02F 1/1677
2020/0287051 A1* 9/2020 Masumo ........... H01L 21/02631
2020/0395912 A1* 12/2020 Lee ........................ H03H 9/132
2020/0411692 A1* 12/2020 Dewey ................. H10D 62/862
2021/0013314 A1* 1/2021 Hu ....................... H10D 64/252
2021/0036023 A1* 2/2021 Agrawal .............. H10D 62/151
2021/0202476 A1* 7/2021 Huang ............... H10D 84/0186
2021/0375891 A1* 12/2021 Young .................... H10B 12/31
2021/0376151 A1* 12/2021 Van Dal ............ H01L 21/02483
2021/0376162 A1* 12/2021 Van Dal ................. H10D 99/00
2021/0399051 A1* 12/2021 Wu ........................ H10B 53/30
2022/0013356 A1* 1/2022 Li ..................... H01L 29/78606
2023/0034708 A1* 2/2023 Murray .................. H10D 84/08

OTHER PUBLICATIONS

"Back end of line", Wikipedia, 2006, pp. 1-4.
U.S. Office Action for U.S. Appl. No. 17/466,148, dated Mar. 19, 2024.

* cited by examiner 100m
122m
122m
120m
120m
116
114
112
110
106
102
104

METHOD FOR MANUFACTURING SEMICONDUCTOR STRUCTURE WITH THIN FILM TRANSISTOR

PRIORITY CLAIM AND CROSS-REFERENCE

This application is a Divisional Application of U.S. patent application Ser. No. 17/466,148, filed on Sep. 3, 2021, which claims the benefit of U.S. Provisional Application No. 63/195,895, filed on Jun. 2, 2021, the entirety of which is incorporated by reference herein.

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process, and the integration of fabrication of the various devices can be challenging.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIG. 1 illustrates a diagrammatic top view of a semiconductor structure in accordance with some embodiments.
Figure 1:
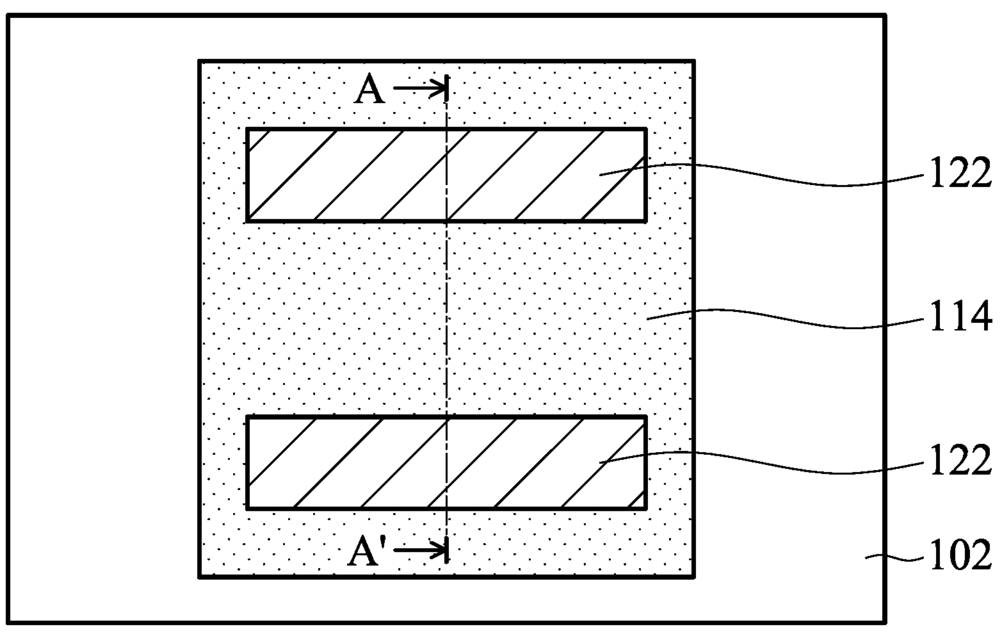

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

Embodiments of semiconductor structures and methods for forming the same are provided. The semiconductor structures may include a thin film transistor formed over an interconnect structure. The thin film transistor may include an oxide semiconductor layer which is configured to be used as an active layer and a source/drain contact connected to the oxide semiconductor layer. In addition, an additional indium containing feature may be formed before the source/drain contact is formed. The indium containing feature may help to reduce the contact resistance and the Schottky barrier. Accordingly, the performance of the resulting device may be improved.

Furthermore, the thin film transistor may be applied to a back-end-of-line (BEOL) structure of a device die. That is, a front-end-of-line (FEOL) structure including active devices (e.g., metal-oxide-semiconductor (MOS) FETs) formed on a semiconductor substrate (e.g., a semiconductor wafer) may be positioned below the BEOL structure. Conductive features in an interconnect structure in the BEOL structure may be electrically connected to the thin film transistor and the underlying active devices. Since the thin film transistors may be formed in the BEOL structure, the size of the FEOL structure may be reduced, and the size of the resulting device may therefore be reduced.

FIG. 1 illustrates a diagrammatic top view of a semiconductor structure 100 in accordance with some embodiments. FIG. 1 has been simplified for the sake of clarity to better understand the inventive concepts of the present disclosure. Additional features may be included in the semiconductor structure 100, and some of the features described below may be replaced, modified, or eliminated.

FIGS. 2A to 2F illustrate cross-sectional views of intermediate stages of manufacturing the semiconductor structure 100 in accordance with some embodiments. More specifically, FIGS. 2A to 2F illustrate cross-sectional views of intermediate stages of manufacturing the semiconductor structure 100 shown along line A-A' of FIG. 1 in accordance with some embodiments.

Figure 2A:
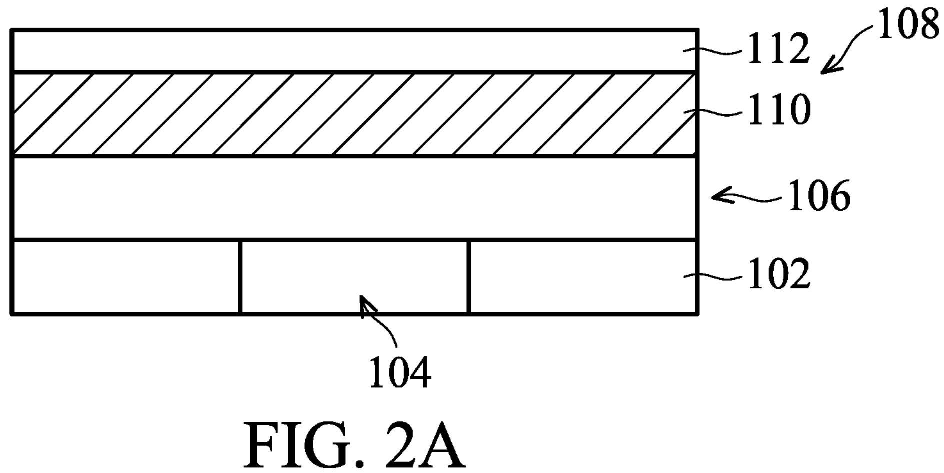
FIGS. 2A to 2F illustrate cross-sectional views of intermediate stages of manufacturing the semiconductor structure in accordance with some embodiments.

A device region 104 is formed in a substrate 102, as shown in FIG. 2A in accordance with some embodiments. The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, the substrate 102 may include structures such as doped regions, interlayer dielectric (ILD) layers, conductive features, and/or isolation structures. Furthermore, the substrate 102 may further include single or multiple material layers to be patterned. For example, the material layers may include a silicon layer, a dielectric layer, and/or a doped poly-silicon layer.

The device region 104 may have various device elements. Examples of device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes may be performed to form the device elements, such as deposition, etching, implantation, photolithography, annealing, and other applicable processes.

An interconnect structure 106 is formed over the substrate 102, as shown in FIG. 2A in accordance with some embodiments. The interconnect structure 106 may include multiple metallization layers (not shown), and each of the metallization layers includes metallization patterns in dielectric layers. The metallization patterns may be electrically coupled to the devices in the substrate 102, and include conductive structures, such as metal lines and metal vias, formed in one or more inter-metal dielectric (IMD) layers. The interconnect structure 106 may be formed by damascene processes, such as a single damascene process, a dual damascene process, or the like.

A gate structure 108 is formed over the interconnect structure 106, as shown in FIG. 2A in accordance with some embodiments. The gate structure 108 may be electrically connected to the conductive structures in the interconnect structure 106. In some embodiments, the gate structure 108 includes a bottom electrode layer 110 and a gate dielectric layer 112.

In some embodiments, the bottom electrode layer 110 is made of conductive material such as a metallic material, a metal compound, polycrystalline silicon, or doped silicon. Examples of the conductive material may include, but are not limited to, Cu, Pt, Au, Ti, TiN, TiC, Ta, TaN, W, $WN_x$, $WSi_x$, Fe, Ni, Be, Cr, Co, Sb, Ir, Nb, Mo, Os, Th, V, Ru, $RUO_x$, Ag, Al, alloys thereof, or a combination thereof. The bottom electrode layer 110 may be formed by performing an electro-chemical plating process, CVD, ALD, PVD, sputtering, plating, or the like.

In some embodiments, the gate dielectric layer 112 is made of one or more layers of dielectric materials, such as $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, and/or is doped with aluminum, silicon, lanthanum, scandium, calcium, barium, gadolinium, yttrium, strontium, or other applicable element, or a combination thereof. In some embodiments, the gate dielectric layer 112 is formed using CVD, ALD, other applicable methods, or a combination thereof. The gate dielectric layer 112 may be made of a single-layer or may include a plurality of films with different materials.

Figure 2B:
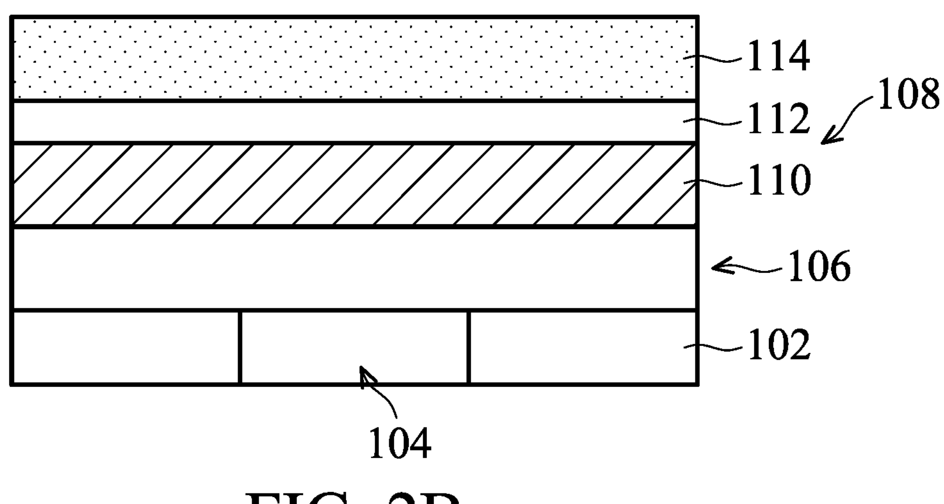

Afterwards, an oxide semiconductor layer 114 is formed over the gate dielectric layer 112, as shown in FIG. 2B in accordance with some embodiments. The oxide semiconductor layer 114 may also be called as an active layer or a channel layer.

In some embodiments, the oxide semiconductor layer 114 is made of indium gallium zinc oxide (InGaZnO, IGZO), indium gallium oxide (InGaO), gallium oxide (GaOx), indium oxide (InOx), indium zinc oxide (InZnO), indium tin oxide (InSnO), tungsten-doped indium oxide (InWO), or a combination thereof. The oxide semiconductor layer 114 may be formed by performing a CVD, PVD, ALD, plasma-enhanced CVD (PECVD), epitaxial growth, or other applicable processes. In some embodiments, the oxide semiconductor layer 114 has a thickness in a range from about 4 nm to about 30 nm.

Figure 2C:
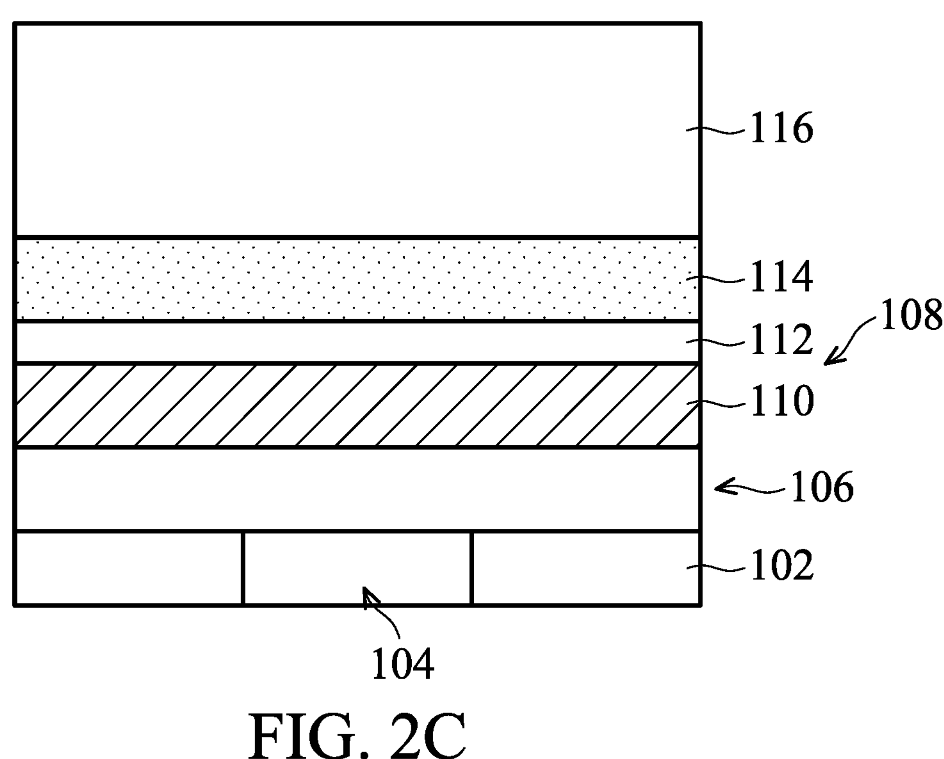

After the oxide semiconductor layer 114 is formed, a dielectric layer 116 is formed over the oxide semiconductor layer 114, as shown in FIG. 2C in accordance with some embodiments. The dielectric layer 116 may include multi-layers made of multiple dielectric materials, such as silicon oxide, silicon nitride, silicon oxynitride, phosphosilicate glass (PSG), borophosphosilicate glass (BPSG), or other applicable low-k dielectric materials. The dielectric layer 116 may be formed by chemical vapor deposition (CVD), physical vapor deposition, (PVD), atomic layer deposition (ALD), or other applicable processes.

Figure 2D:
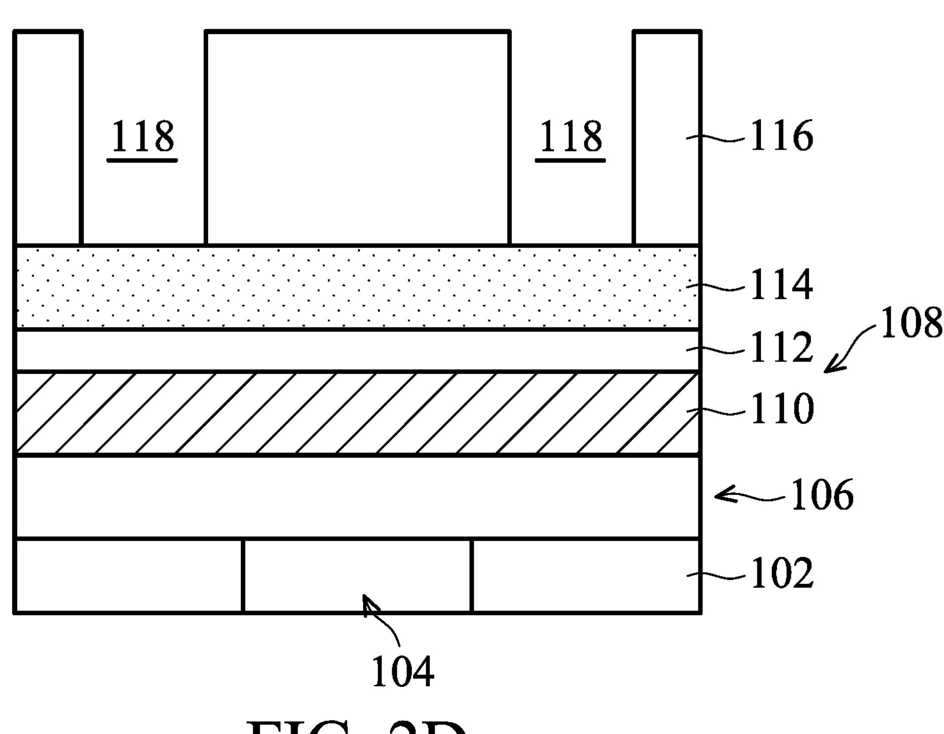

Next, trenches 118 are formed through the dielectric layer 116 to partially expose the oxide semiconductor layer 114, as shown in FIG. 2D in accordance with some embodiments. The trenches 118 may be formed using a photolithography process and an etching process.

Figure 2E:
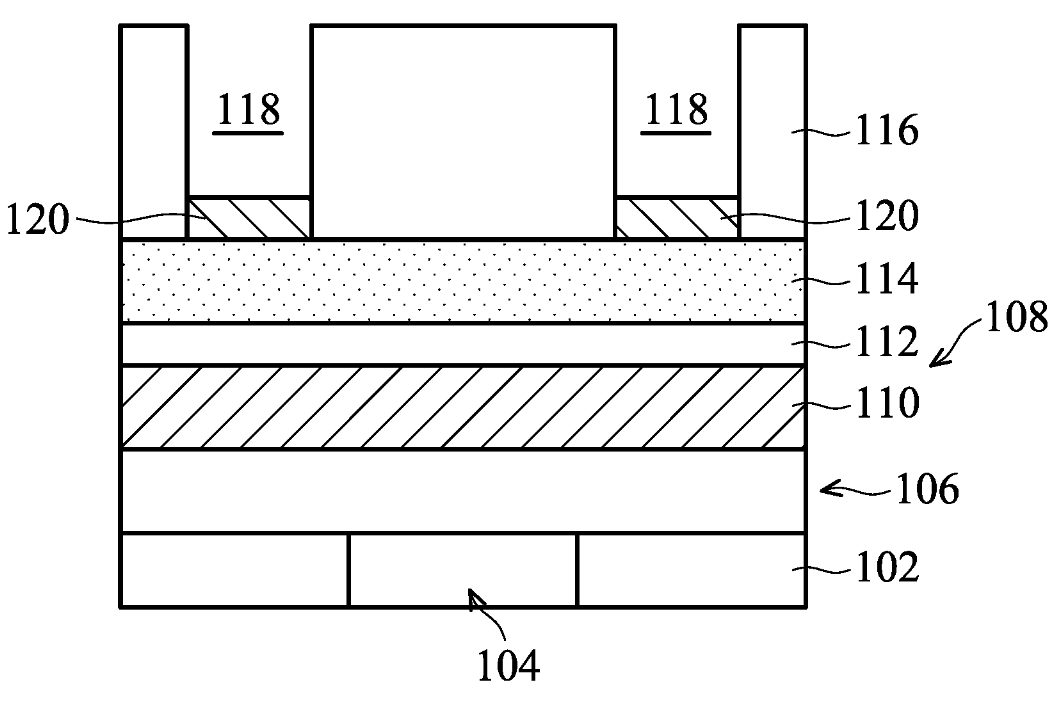

After the trenches 118 are formed, indium-containing features 120 are formed in the trenches 118, as shown in FIG. 2E in accordance with some embodiments. The indium-containing features 120 may be formed to reduce the resistance of the source/drain contact formed afterwards. In addition, the indium-containing features 120 may absorb the hydrogen gas and/or the free hydrogen atoms released from the material layers underneath and thereby become being doped by the hydrogen gas and/or the free hydrogen atoms, so that the Schottky barrier may be reduced.

In some embodiments, the indium-containing features 120 are formed by performing chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. In some embodiments, the indium-containing features 120 are formed by performing a selective deposition process, so that the indium-containing material is deposited on the exposed top surface of the oxide semiconductor layer 114 but not on the sidewalls and the top surface of the dielectric layer 116.

In some embodiments, the indium concentration of the indium-containing features 120 is higher than 25%. In some embodiments, the indium concentration of the indium-containing features 120 is in a range from about 25% to about 100%. In some embodiments, the oxide semiconductor layer 114 is also made of an indium containing material, and the ratio of the indium concentration in the indium-containing features 120 to the indium concentration in the oxide semiconductor layer 114 is in a range from about 1 to about 10.

In some embodiments, the indium-containing features 120 are made of pure In and the thickness of the indium-containing features 120 is in a range from about 1 nm to about 30 nm. In some embodiments, the indium containing features 120 are made of an In-rich oxide and the thickness of the indium-containing features 120 is in a range from about 1 nm to about 20 nm. In some embodiments, the In-rich oxide includes $In_2O_3$, InZnO, InGaZnO, InSnO, or the like. When the indium-containing features 120 are made of the In-rich oxide, the indium-containing features 120 may be relatively thinner than when they are made of pure indium, so that the resistance can be well controlled.

Figure 2F:
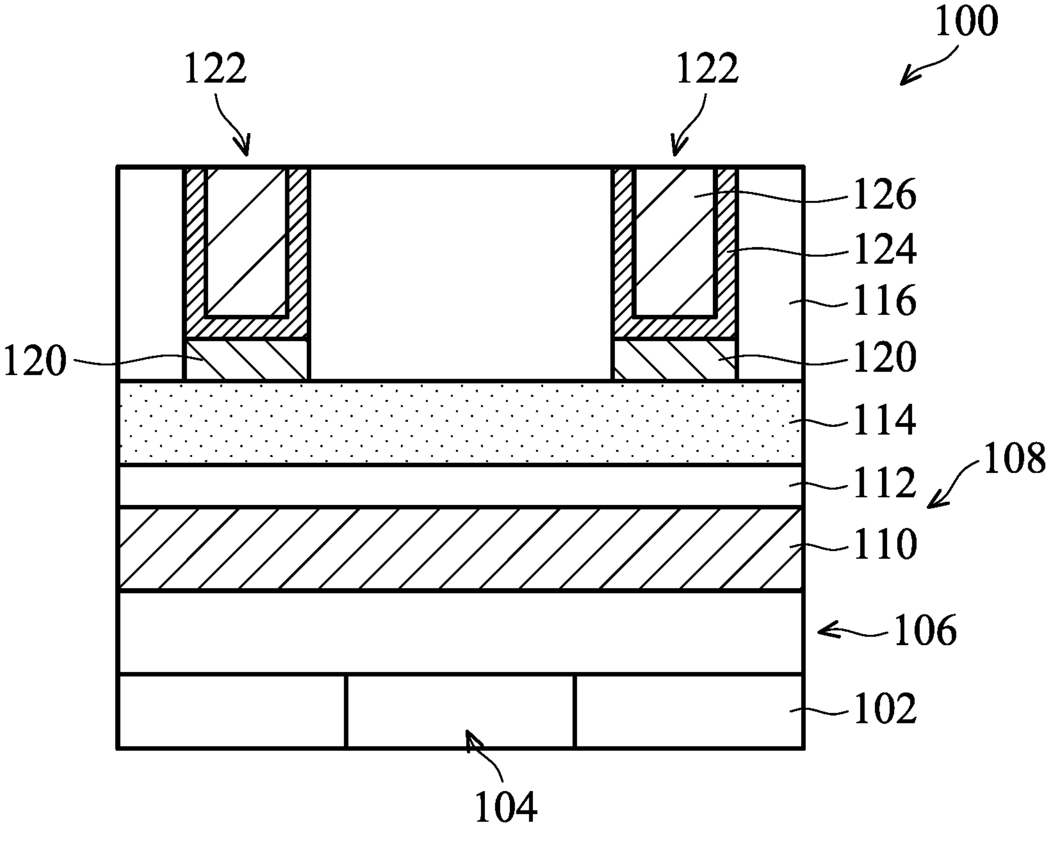

After the indium-containing features 120 are formed in the bottom portion of the trenches 118, source/drain contacts 122 are formed over the indium-containing features 120 in the trenches 118, as shown in FIG. 2F in accordance with some embodiments.

In some embodiments, the source/drain contact 122 includes a liner 124 and a contact material layer 126. In addition, the liner 124 is in direct contact with the indium-containing features 120. In some embodiments, the liner 124 is made of silicon nitride, tantalum nitride, tantalum, titanium, titanium nitride, although other applicable dielectric may be used as an alternative.

In some embodiments, the liner 124 is configured to protect the source/drain contacts 122 from hydrogen released from the material layers underneath. In some embodiments, the liner 124 is a hydrogen-absorbing layer made of zinc oxide (e.g., ZnO), gallium oxide (e.g., $Ga_2O_3$), ZrxNiy, indium oxide (e.g., InO, $In_2O_3$, etc.), indium gallium zinc oxide (InGaZnO, IGZO), crystalline InGaZnO (c-IGZO), indium gallium zinc silicon oxide (IGSZO, InGaSiZnOx), tungsten-doped indium oxide (InWO), indium tin oxide (e.g., InSnO), indium zinc oxide (e.g., InZnO), or a combination thereof. In some embodiments, the liner 124 has a thickness in a range from about 2 nm to about 10 nm.

In some embodiments, the contact material layer 126 is made of aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

The source/drain contacts 122 may be formed by conformally forming the liner 124 covering the tops surface of the indium-containing features 120, the sidewalls of the trenches 118, and the top surface of the dielectric layer 116, forming the contact material layer 126 over the liner 124, and polishing the excessed liner 124 and the contact material layer 126 until the top surface of the dielectric layer 116 is exposed. The liner 124 and the contact material layer 126 may be formed by performing chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The liner 124 and the contact material layer 126 may be polished by performing a CMP process, although other polishing process may also be performed.

As described previously, the semiconductor structure 100 includes a thin film transistor formed over the interconnect structure 106 in the BEOL structure in accordance with some embodiments. The thin film transistor includes the bottom electrode layer 110 formed over the interconnect structure 106, the gate dielectric layer 112 formed over the bottom electrode layer 110, the oxide semiconductor layer 114 formed over the gate dielectric layer 112, the indium-containing features 120 covering the top surface of the oxide semiconductor layer 114, and the source/drain contacts 122 formed over the indium-containing features 120 in accordance with some embodiments.

In some embodiments, the gate dielectric layer 112 is in direct contact with the bottom electrode layer 110 and the oxide semiconductor layer 114. In some embodiments, the dielectric layer 116 surrounds and in direct contact with the indium-containing features 120 and the source/drain contacts 122 (e.g. liner 124) and covers the top surface of the oxide semiconductor layer 114. In some embodiments, the oxide semiconductor layer 114 has a substantially flat bottom surface and a substantially flat top surface.

By forming the indium-containing features 120 before forming the source/drain contacts 122, the source/drain contacts 122 can be connected to the oxide semiconductor layer 114 through the indium-rich features 120, and the resistance may therefore be reduced. In some embodiments, the indium-containing features 120 are sandwiched between the oxide semiconductor layer 114 and the liner 124 of the source/drain contacts 122.

FIGS. 3A to 3E illustrate cross-sectional views of intermediate stages of manufacturing a semiconductor structure **100*a* in accordance with some embodiments. The semiconductor structure 100*a* may be similar to the semiconductor structure 100 shown in FIG. 2F, except its indium-containing features are formed and patterned first in accordance with some embodiments. Materials and processes for manufacturing the semiconductor structure 100*a* may be similar to, or the same as, those for manufacturing the semiconductor structure 100** described above and are not repeated herein.

More specifically, processes shown in FIGS. 2A and 2B and described previously are performed to form the substrate 102 having the device region 104, the interconnect structure 106, the bottom electrode layer 110, the gate dielectric layer 112, and the oxide semiconductor layer 114 in accordance with some embodiments.

Figure 3A:
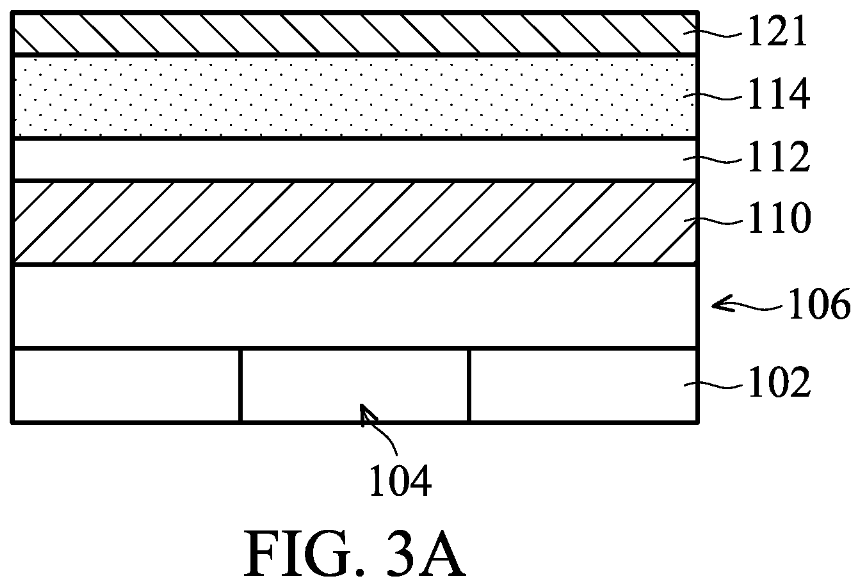
FIGS. 3A to 3E illustrate cross-sectional views of intermediate stages of manufacturing a semiconductor structure in accordance with some embodiments.

Next, an indium-containing layer 121 is formed over the oxide semiconductor layer 114, as shown in FIG. 3A in accordance with some embodiments. The indium-containing layer 121 may be made of a material similar to, or the same as, the indium-containing features 120 described previously and are not repeated herein.

Figure 3B:
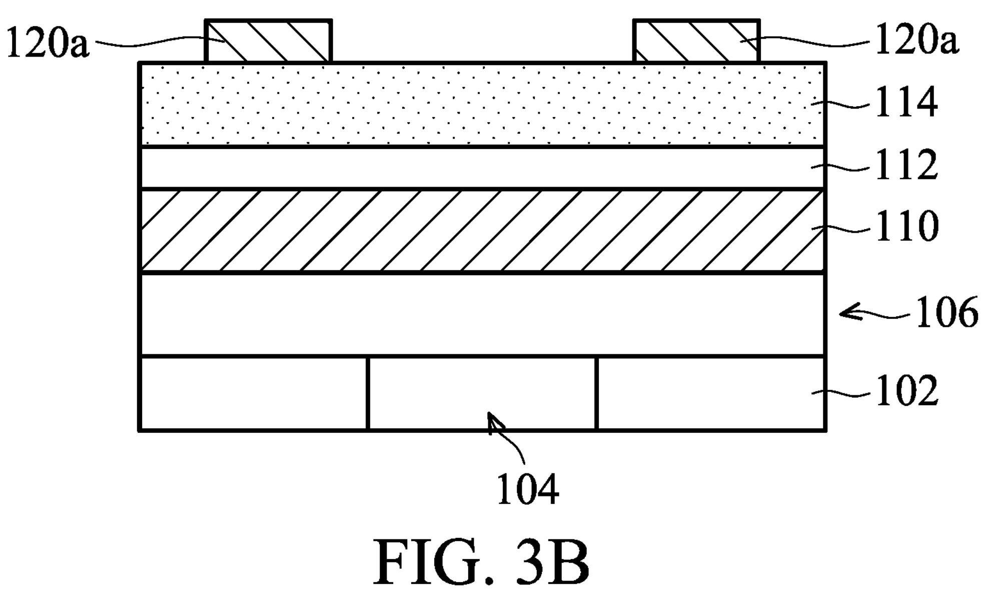

Next, the indium-containing layer 121 is patterned to form indium-containing features **120*a*, as shown in FIG. 3B in accordance with some embodiments. The indium-containing layer 121 may be patterned by forming a photoresist layer over the indium-containing layer 121 and etching the indium-containing layer 121 through openings of the photoresist layer. Similar to the indium-containing features 120 described previously, the indium-containing features 120***a* may be formed to reduce the Schottky barrier and the resistance of the resulting devices.

Figure 3C:
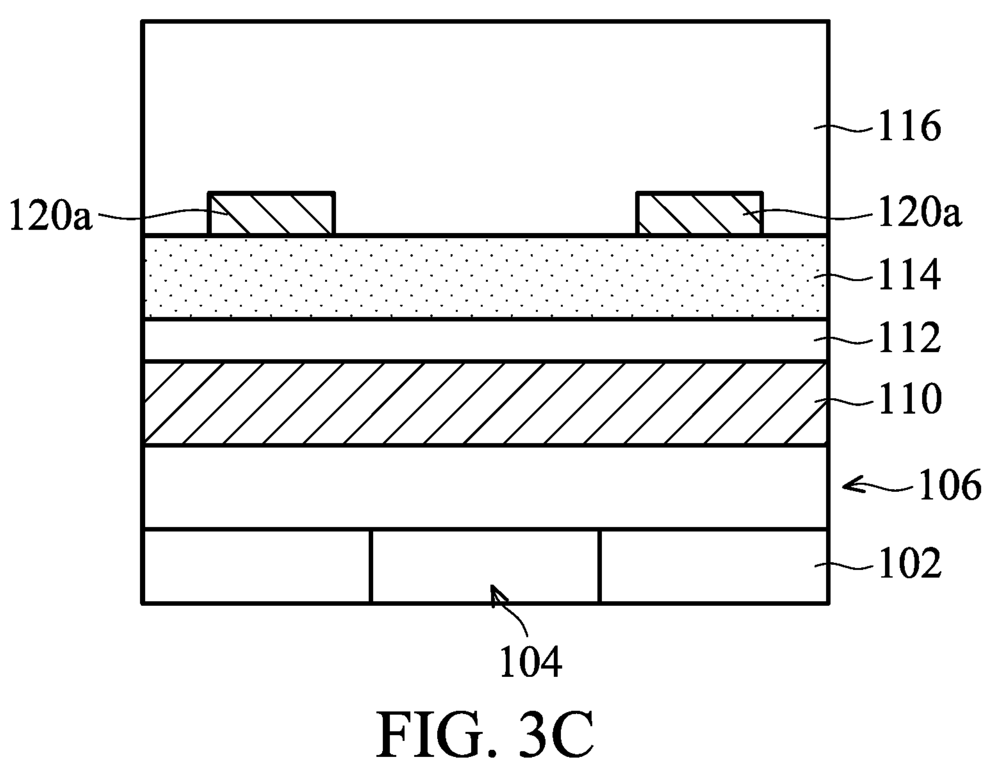

After the indium-containing features 120*a* are formed, the dielectric layer 116 is formed over the oxide semiconductor layer 114, as shown in FIG. 3C in accordance with some embodiments. In some embodiments, the top surface and sidewalls of the indium-containing features 120*a* and the top surface of the oxide semiconductor layer 114 are covered by the dielectric layer 116.

Figure 3D:
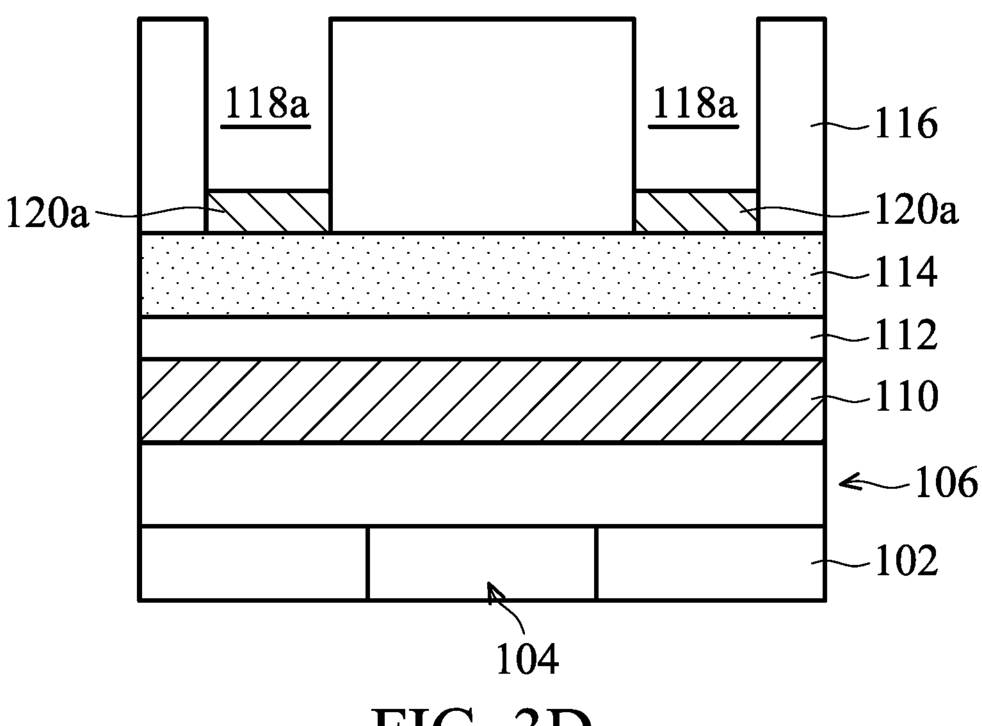

Next, trenches 118*a* are formed through the dielectric layer 116 to expose the top surface of the indium-containing features 120*a*, as shown in FIG. 3D in accordance with some embodiments. The trenches 118*a* may be formed using a photolithography process and an etching process. In some embodiments, the width of the trench 118*a* is substantially equal to the width of the indium-containing feature 120*a*.

Figure 3E:
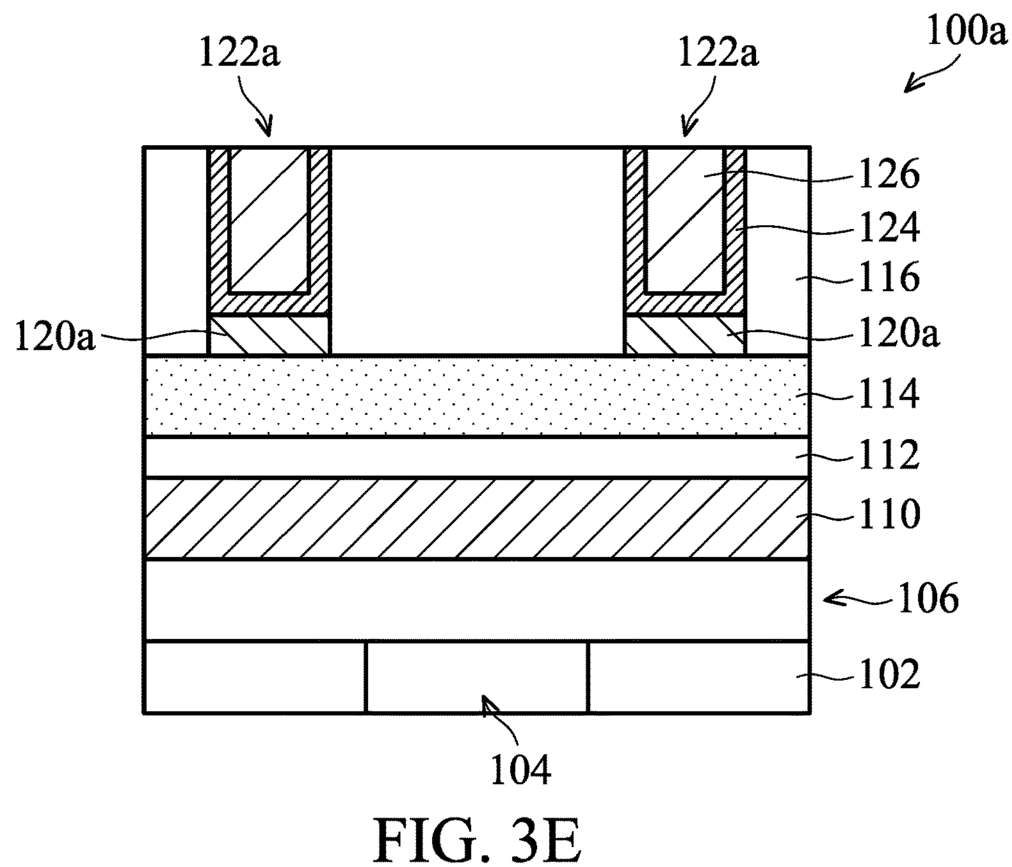

Afterwards, the source/drain contacts 122*a* are formed in the trenches 118*a*, as shown in FIG. 3E in accordance with some embodiments. In some embodiments, the source/drain contacts 122*a* include the liner 124 and the contact material layer 126. In some embodiments, the source/drain contacts 122*a* and the indium-containing features 120*a* have substantially the same width.

Figure 4A:
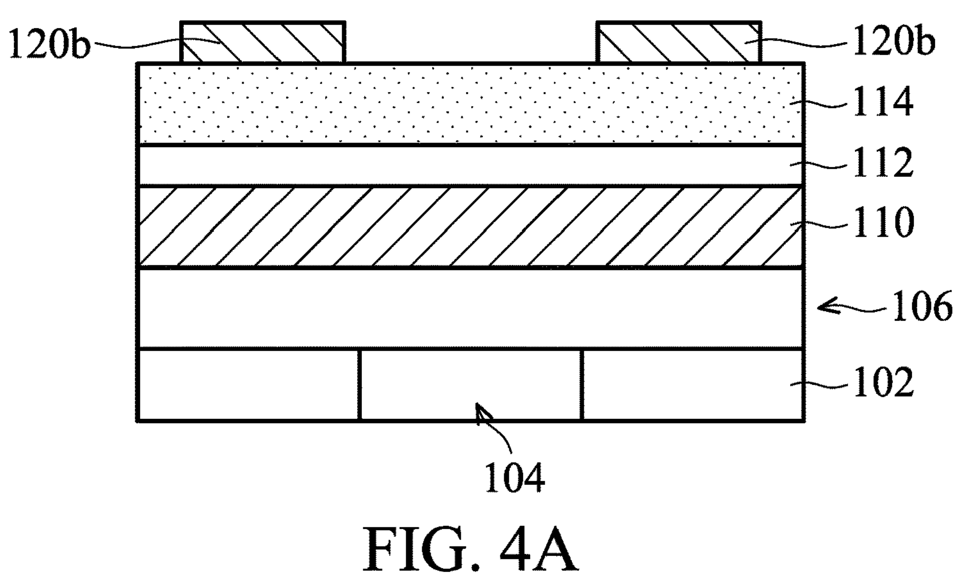
FIGS. 4A to 4C illustrate cross-sectional views of intermediate stages of manufacturing a semiconductor structure in accordance with some embodiments.
Figure 4B:
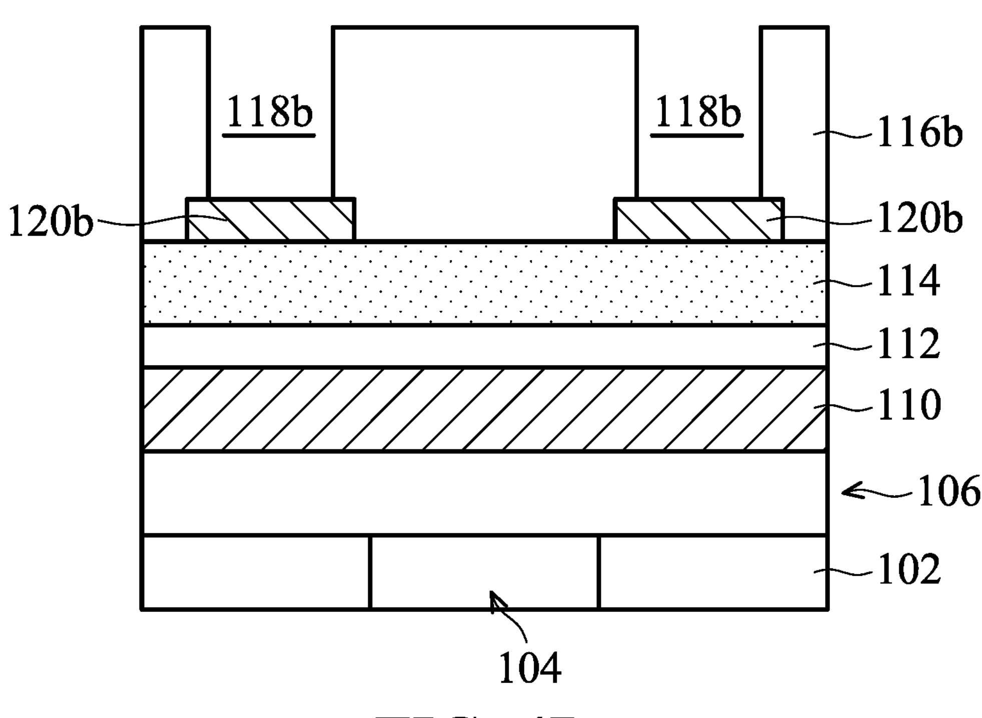
Figure 4C:
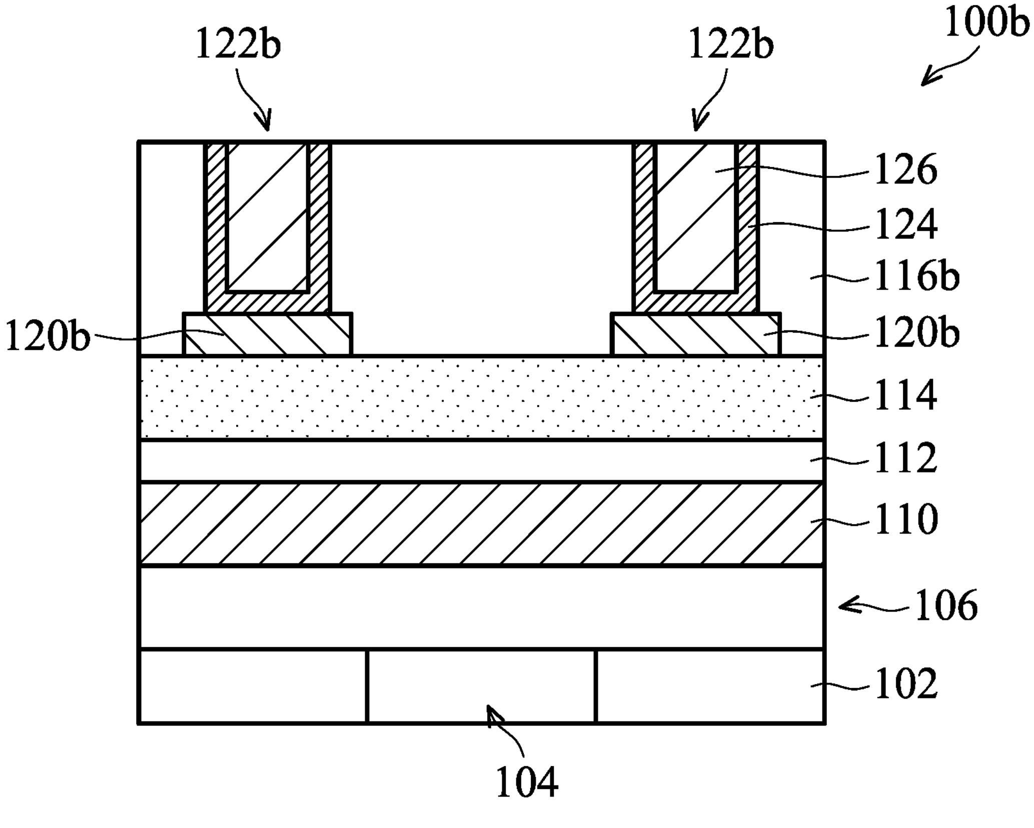

FIGS. 4A to 4C illustrate cross-sectional views of intermediate stages of manufacturing a semiconductor structure 100*b* in accordance with some embodiments. The semiconductor structure 100*b* may be similar to the semiconductor structure 100*a* shown in FIG. 3E, except its indium-containing features are wider than the source/drain contacts in accordance with some embodiments. Materials and processes for manufacturing the semiconductor structure 100*b* may be similar to, or the same as, those for manufacturing the semiconductor structures 100 and 100*a* described above and are not repeated herein.

More specifically, processes shown in FIGS. 3A and 3B and described previously are performed to form the substrate 102 having the device region 104, the interconnect structure 106, the bottom electrode layer 110, the gate dielectric layer 112, and the oxide semiconductor layer 114 in accordance with some embodiments. In addition, an indium-containing layer is formed and patterned to form indium-containing features 120*b* over the oxide semiconductor layer 114, as shown in FIG. 4A in accordance with some embodiments. Processes and materials for forming the indium-containing layer and the indium-containing features 120*b* shown in FIG. 4A may be similar to, or the same as, those for forming the indium-containing layer 121 and the indium-containing features 120*a* and are not repeated herein.

Next, a dielectric layer 116*b* is formed over the indium-containing features 120*b* and the oxide semiconductor layer 114, and trenches 118*b* are formed through the dielectric layer 116*b*, as shown in FIG. 4B in accordance with some embodiments. The trenches 118*b* may be formed using a photolithography process and an etching process. In some embodiments, the indium-containing features 120*b* are wider than the trenches 118*b*. That is, the indium-containing features 120*b* are partially exposed by the trenches 118*b* and partially covered by the dielectric layer 116*b*.

Afterwards, the source/drain contacts 122*b* are formed in the trenches 118*b*, as shown in FIG. 4C in accordance with some embodiments. In some embodiments, the source/drain contacts 122*b* include the liner 124 and the contact material layer 126. In some embodiments, the source/drain contacts 122*b* are narrower than the indium-containing features 120*b*. In some embodiments, the source/drain contact 122*b* covers the middle portion (e.g. central portion) of the top surface of the indium-containing feature 120*b* and the dielectric layer 116*b* covers the periphery portion of the top surface of the indium-containing feature 120*b*. The processes and materials for forming the dielectric layer 116*b* and the source/drain contacts 122*b* are the same as those for forming the dielectric layer 116 and the source/drain contacts 122 described previously and are not repeated herein.

Figure 5:
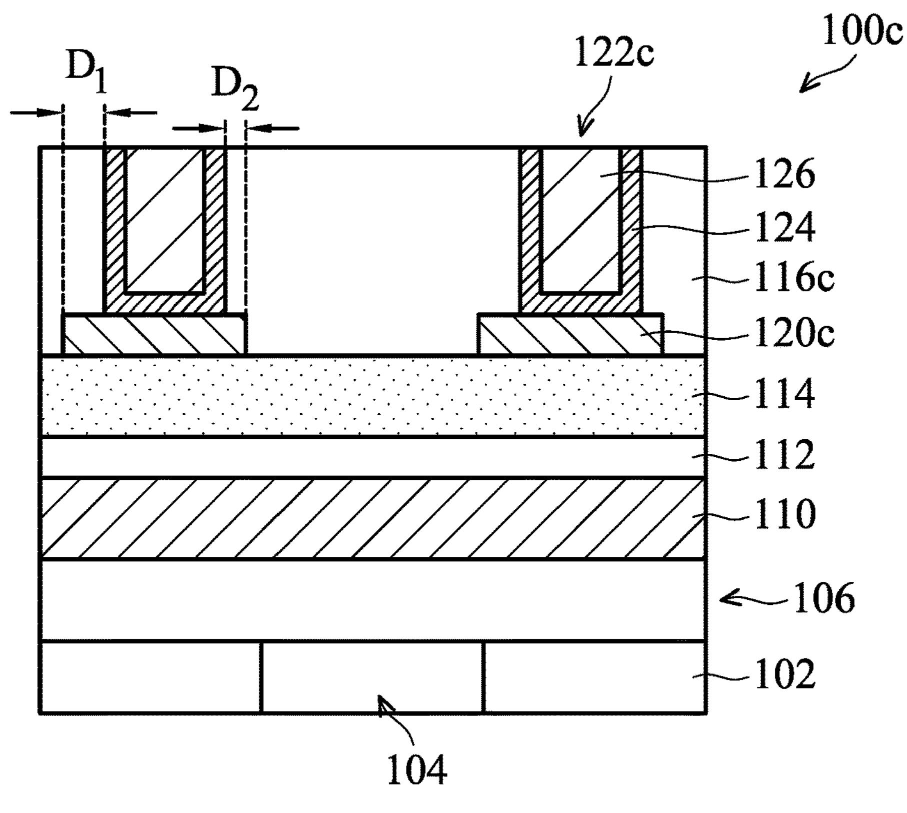
FIG. 5 illustrates a cross-sectional view of a semiconductor structure in accordance with some embodiments.

FIG. 5 illustrates a cross-sectional view of a semiconductor structure 100*c* in accordance with some embodiments. The semiconductor structure 100*c* may be similar to the semiconductor structure 100*b* shown in FIG. 4C, except the special relationship between the indium-containing features and the source/drain contacts are different in accordance with some embodiments. Materials and processes for manufacturing the semiconductor structure 100*c* may be similar to, or the same as, those for manufacturing the semiconductor structures 100, 100*a*, and 100*b* described above and are not repeated herein.

More specifically, processes similar to those shown in FIGS. 4A to 4C and described previously are performed, but source/drain contacts 122*c* formed in a dielectric layer 116*c* are not position in the center of indium-containing features 120*c* in accordance with some embodiments.

In some embodiments, a first distance $D_1$ between a first sidewall of the source/drain contact 122*c* and a first sidewall of the indium-containing feature 120*c* is greater than a second distance D2 between a second sidewall of the source/drain contact 122*c* and a second sidewall of the indium-containing feature 120*c*, as shown in FIG. 5. The processes and materials for forming the dielectric layer 116*c*, the indium-containing features 120*c*, and the source/drain contacts 122*c* are the same as those for forming the dielectric layer 116*b*, the indium-containing features 120*b*, and the source/drain contacts 122*b* described previously and are not repeated herein.

Figure 6:
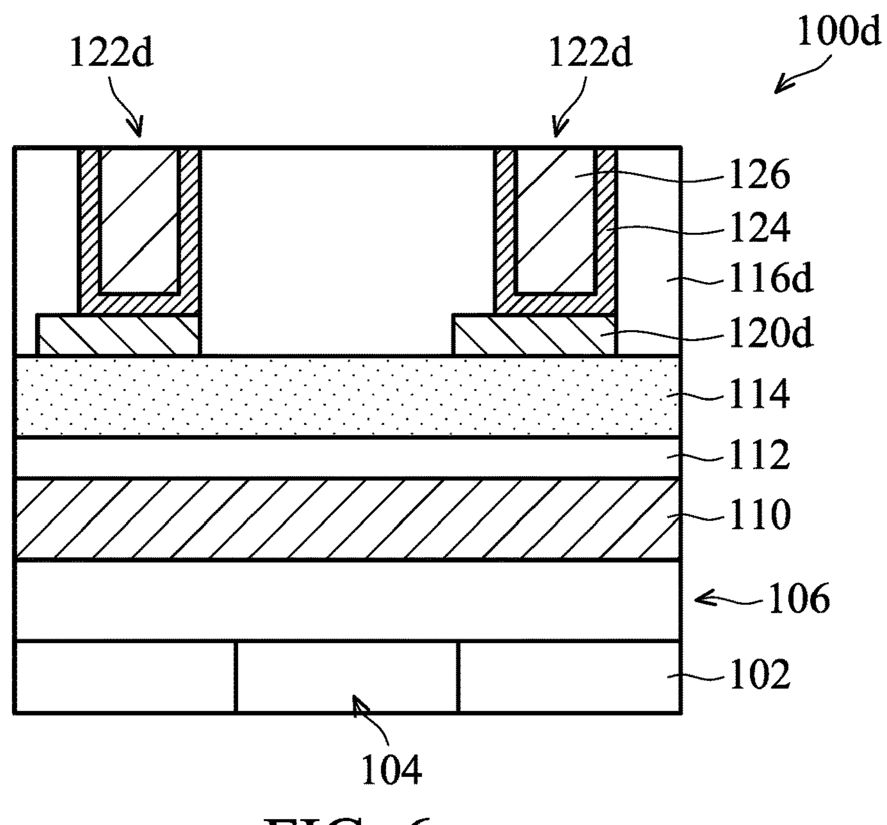
FIG. 6 illustrates a cross-sectional view of a semiconductor structure in accordance with some embodiments.

FIG. 6 illustrates a cross-sectional view of a semiconductor structure 100*d* in accordance with some embodiments. The semiconductor structure 100*d* may be similar to the semiconductor structure 100*b* shown in FIG. 4C, except the special relationship between indium-containing features and the source/drain contacts are different in accordance with some embodiments. Materials and processes for manufacturing the semiconductor structure 100*d* may be similar to, or the same as, those for manufacturing the semiconductor structures 100, 100*a*, 100*b*, and 100*c* described above and are not repeated herein.

More specifically, processes similar to those shown in FIGS. 4A to 4C and described previously are performed, but source/drain contacts 122*d* formed in a dielectric layer 116*d* are not position in the center of indium-containing features 120*d* in accordance with some embodiments.

In some embodiments, a first sidewall of the source/drain contact 122*d* is substantially aligned with a first sidewall of the indium-containing feature 120*d*, while a second sidewall of the source/drain contact 122*d* is apart from (e.g. indented from) a second sidewall of the indium-containing feature 120*d*. The processes and materials for forming the dielectric layer 116*d*, the indium-containing features 120*d*, and the source/drain contacts 122*d* are the same as those for forming the dielectric layer 116*b*, the indium-containing features 120*b*, and the source/drain contacts 122*b* described previously and are not repeated herein.

Figure 7A:
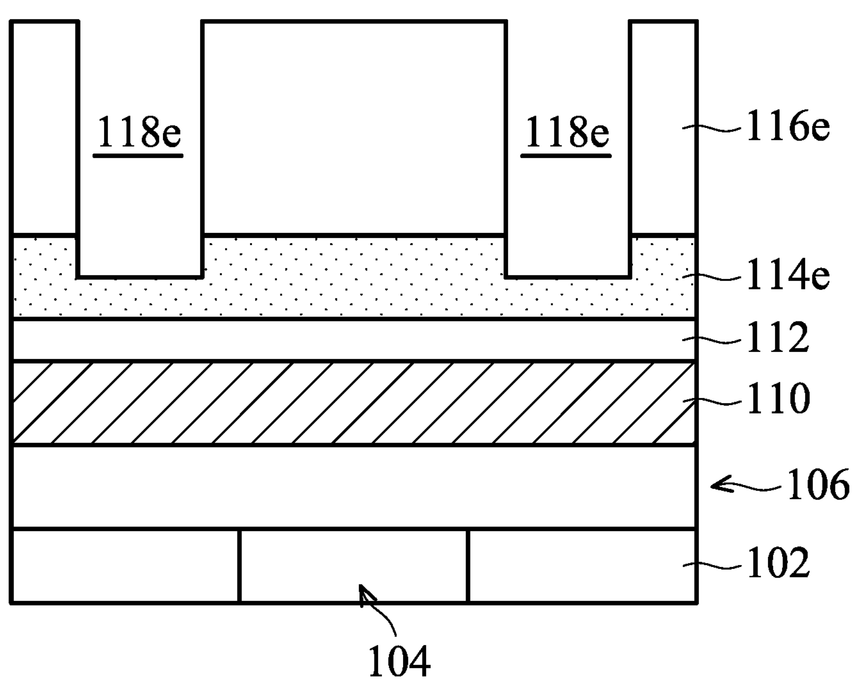
FIGS. 7A and 7B illustrate cross-sectional views of intermediate stages of manufacturing a semiconductor structure in accordance with some embodiments.
Figure 7B:
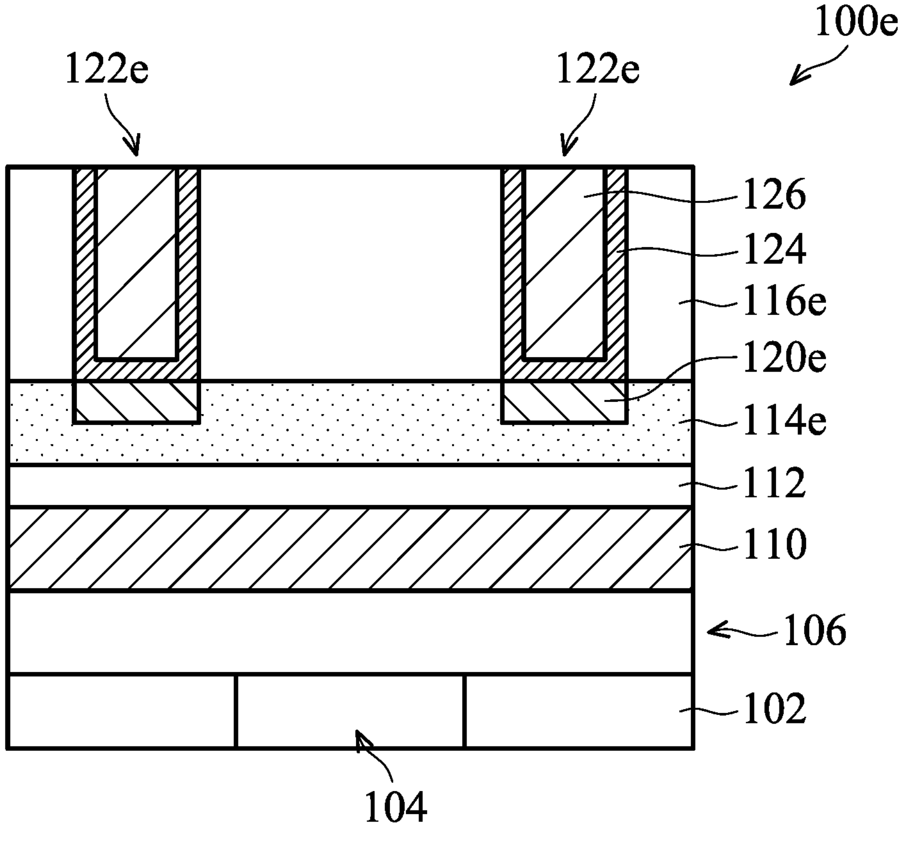

FIGS. 7A and 7B illustrate cross-sectional views of intermediate stages of manufacturing a semiconductor structure 100*e* in accordance with some embodiments. The semiconductor structure 100*e* may be similar to the semiconductor structure 100 shown in FIG. 2F, except its indium-containing features are embedded in its oxide semiconductor layer in accordance with some embodiments. Materials and processes for manufacturing the semiconductor structure 100*e* may be similar to, or the same as, those for manufacturing the semiconductor structures 100, 100*a*, 100*b*, 100*c*, and 100*d* described above and are not repeated herein.

More specifically, processes shown in FIGS. 2A to 2C and described previously are performed to form the substrate 102 having the device region 104, the interconnect structure 106, the bottom electrode layer 110, the gate dielectric layer 112, an oxide semiconductor layer 114*e*, and a dielectric layer 116*e* in accordance with some embodiments. Next, trenches 118*e* are formed through the dielectric layer 116*e* and extending into the upper portion of the oxide semiconductor layer 114*e*, as shown in FIG. 7A in accordance with some embodiments. That is, some portions of the oxide semiconductor layer 114*e* are also removed, and the bottom surfaces of the trenches 118*e* are lower than the topmost surface of the oxide semiconductor layer 114*e* in accordance with some embodiments. The trenches 118*e* may be formed using a photolithography process and an etching process. In some embodiments, the dielectric layer 116*e* and the oxide semiconductor layer 114*e* are etched by performing the same etching process.

After the trenches 118*e* are formed, processes shown in FIGS. 2E and 2F are performed to form indium-containing features 120*e* and source/drain contacts 122*e* in the trenches 118*e*, as shown in FIG. 7B in accordance with some embodiments. Since the trenches 118*e* extend into the oxide semiconductor layer 114*e*, the indium-containing features 120*e* formed in the bottom portions of the trenches 118*e* are embedded in the oxide semiconductor layer 114*e* in accordance with some embodiments.

In some embodiments, the bottom surface of the indium-containing feature 120*e* is lower than the top surface of the oxide semiconductor layer 114*e*. In some embodiments, the interface between the indium-containing feature 120*e* and the source/drain contact 122*e* (i.e. the top surface of the indium-containing features 120*e*) is substantially level with the top surface of the oxide semiconductor layer 114*e*. In some embodiments, the indium-containing feature 120*e* has a thickness in a range from about 0.5 nm to about 20 nm.

The processes and materials for forming the oxide semiconductor layer 114*e*, the dielectric layer 116*e*, the indium-containing features 120*e*, and the source/drain contacts 122*e* are the same as those for forming the oxide semiconductor layer 114, the dielectric layer 116, the indium-containing features 120, and the source/drain contacts 122 described previously and are not repeated herein.

Figure 8:
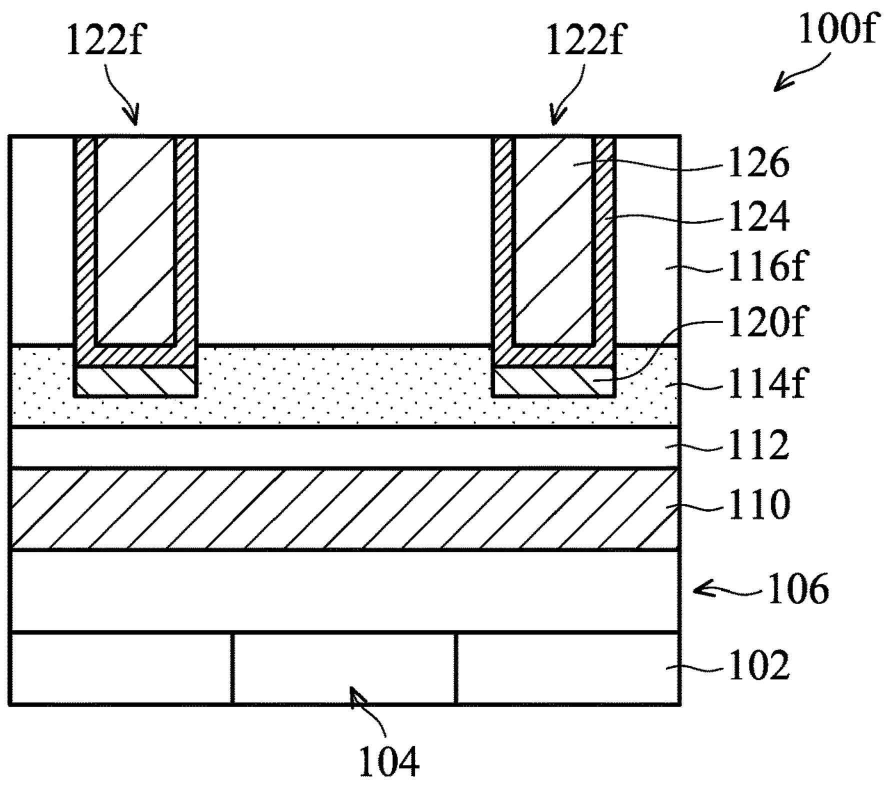
FIG. 8 illustrates a cross-sectional view of a semiconductor structure in accordance with some embodiments.

FIG. 8 illustrates a cross-sectional view of a semiconductor structure 100*f* in accordance with some embodiments. The semiconductor structure 100*f* may be similar to the semiconductor structure 100*e* shown in FIG. 7B, except its source/drain contacts also extend into its oxide semiconductor layer in accordance with some embodiments. Materials and processes for manufacturing the semiconductor structure 100*f* may be similar to, or the same as, those for manufacturing the semiconductor structures 100 and 100*a* to 100*e* described above and are not repeated herein.

More specifically, processes shown in FIGS. 2A to 2C and described previously are performed to form the substrate 102 having the device region 104, the interconnect structure 106, the bottom electrode layer 110, the gate dielectric layer 112, an oxide semiconductor layer 114*f*, and a dielectric layer 116*f* in accordance with some embodiments. Next, trenches, similar to the trenches 118*e*, are formed through the dielectric layer 116*f* and extending into the upper portion of the oxide semiconductor layer 114*f* in accordance with some embodiments. Afterwards, processes shown in FIGS. 2E and 2F may be performed to form indium-containing features 120*f* and source/drain contacts 122*f*, as shown in FIG. 8 in accordance with some embodiments.

In some embodiments, the indium-containing features 120*f* are completely embedded in the oxide semiconductor layer 114*f*. In some embodiments, the top surface of the indium-containing feature 120*f* is lower than the top surface of the oxide semiconductor layer 114*f*. In addition, the bottom portions of the source/drain contacts 122*f* also extend into the oxide semiconductor layer 114*f* in accordance with some embodiments. In some embodiments, the interface between the indium-containing feature 120*f* and the source/drain contact 122*f* (e.g. the bottom surface of the source/drain contacts 122*f* and the top surface of the indium-containing features 120*f*) is lower than the top surface of the oxide semiconductor layer 114*f*. In some embodiments, the indium-containing feature 120*f* has a thickness in a range from about 0.5 nm to about 20 nm.

The processes and materials for forming the oxide semiconductor layer 114*f*, the dielectric layer 116*f*, the indium-containing features 120*f*, and the source/drain contacts 122*f* are the same as those for forming the oxide semiconductor layer 114, the dielectric layer 116, the indium-containing features 120, and the source/drain contacts 122 described previously and are not repeated herein.

Figure 9:
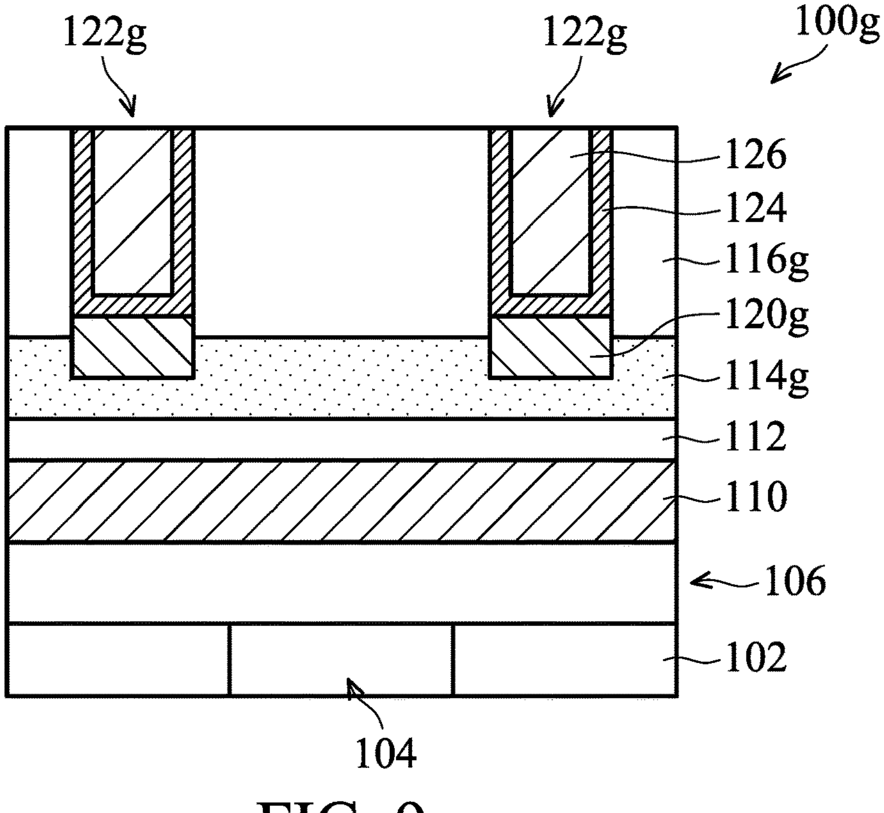
FIG. 9 illustrates a cross-sectional view of a semiconductor structure in accordance with some embodiments.

FIG. 9 illustrates a cross-sectional view of a semiconductor structure 100*g* in accordance with some embodiments. The semiconductor structure 100*g* may be similar to the semiconductor structure 100*e* shown in FIG. 7B, except its indium-containing features only partially embedded in its oxide semiconductor layer in accordance with some embodiments. Materials and processes for manufacturing the semiconductor structure 100*g* may be similar to, or the same as, those for manufacturing the semiconductor structures 100 and 100*a* to 100*f* described above and are not repeated herein.

More specifically, processes shown in FIGS. 2A to 2C and described previously are performed to form the substrate 102 having the device region 104, the interconnect structure 106, the bottom electrode layer 110, the gate dielectric layer 112, an oxide semiconductor layer 114*g*, and a dielectric layer 116*g* in accordance with some embodiments. Next, trenches, similar to the trenches 118*e*, are formed through the dielectric layer 116*g* and extending into the upper portion of the oxide semiconductor layer 114*g* in accordance with some embodiments. Afterwards, processes shown in FIGS. 2E and 2F are performed to form indium-containing features 120*g* and source/drain contacts 122*g*, as shown in FIG. 9 in accordance with some embodiments.

In some embodiments, the bottom portions of the indium-containing features 120*g* are embedded in the oxide semiconductor layer 114*g* while the top portions of the indium-containing features 120*g* are protruding from the oxide semiconductor layer 114*g*. In some embodiments, the top surface of the indium-containing feature 120*g* is higher than the top surface of the oxide semiconductor layer 114*g* and the bottom surface of the indium-containing feature 120*g* is lower than the top surface of the oxide semiconductor layer 114*g*. In some embodiments, the upper portion of the sidewall of the indium-containing feature 120*g* is covered by the dielectric layer 116*g* and the bottom portion of the sidewall of the indium-containing feature 120*g* is covered by the oxide semiconductor layer 114*g*. In some embodiments, the interface between the indium-containing feature 120*g* and the source/drain contact 122*g* is higher than the top surface of the oxide semiconductor layer 114*g*. In some embodiments, the indium-containing feature 120*g* has a thickness in a range from about 0.5 nm to about 20 nm.

The processes and materials for forming the oxide semiconductor layer 114*g*, the dielectric layer 116*g*, the indium-containing features 120*g*, and the source/drain contacts 122*g* are the same as those for forming the oxide semiconductor layer 114, the dielectric layer 116, the indium-containing features 120, and the source/drain contacts 122 described previously and are not repeated herein.

Figure 10A:
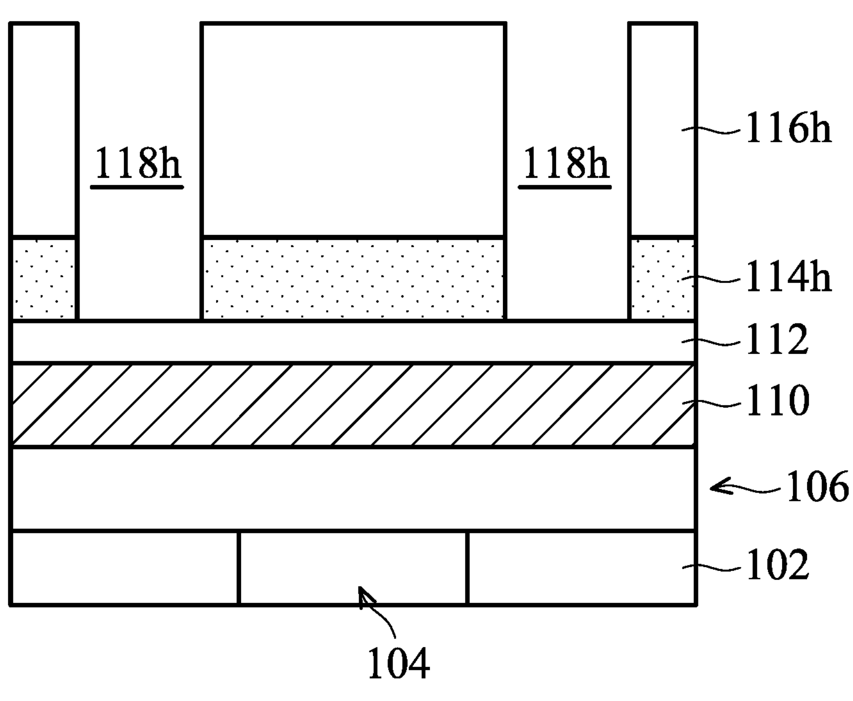
FIGS. 10A and 10B illustrate cross-sectional views of intermediate stages of manufacturing a semiconductor structure in accordance with some embodiments.
Figure 10B:
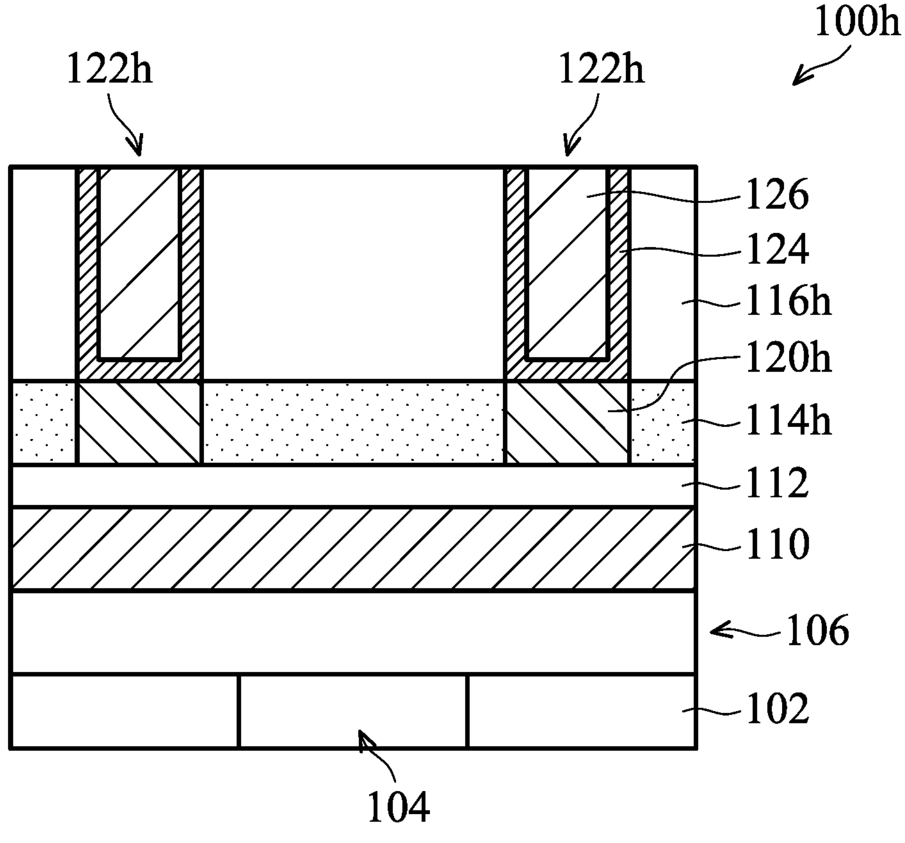

FIGS. 10A and 10B illustrate cross-sectional views of intermediate stages of manufacturing a semiconductor structure 100*h* in accordance with some embodiments. The semiconductor structure 100*h* may be similar to the semiconductor structure 100*e* shown in FIG. 7B, except its indium-containing features are formed through the oxide semiconductor layer in accordance with some embodiments. Materials and processes for manufacturing the semiconductor structure 100*h* may be similar to, or the same as, those for manufacturing the semiconductor structures 100 and 100*a* to 100*g* described above and are not repeated herein.

More specifically, processes shown in FIGS. 2A to 2C and described previously are performed to form the substrate 102 having the device region 104, the interconnect structure 106, the bottom electrode layer 110, the gate dielectric layer 112, an oxide semiconductor layer 114*h*, and a dielectric layer 116*h* in accordance with some embodiments. Next, trenches 118*h* are formed through both the dielectric layer 116*h* and the oxide semiconductor layer 114*h*, as shown in FIG. 10A in accordance with some embodiments. The trenches 118*h* may be formed using a photolithography process and an etching process. In some embodiments, the etching process is performed to etch the dielectric layer 116*h* and the oxide semiconductor layer 114*h* until the top surface of the gate dielectric layer 112 is exposed. In some embodiments, the dielectric layer 116*h* and the oxide semiconductor layer 114*h* are etched by performing the same etching process.

After the trenches 118*h* are formed, processes shown in FIGS. 2E and 2F are performed to form indium-containing features 120*h* and source/drain contacts 122*h* in the trenches 118*h*, as shown in FIG. 10B in accordance with some embodiments. Since the trenches 118*h* extend through the oxide semiconductor layer 114*h*, the indium-containing features 120*h* formed in the bottom portions of the trenches 118*h* are in direct contact with the top surface of the gate dielectric layer 112 and is substantially level with the bottom surface of the oxide semiconductor layer 114*h* in accordance with some embodiments. In some embodiments, the interface between the indium-containing feature 120*h* and the source/drain contact 122*h* is substantially level with the top surface of the oxide semiconductor layer 114*h*.

The processes and materials for forming the oxide semiconductor layer 114*h*, the dielectric layer 116*h*, the indium-containing features 120*h*, and the source/drain contacts 122*h* are the same as those for forming the oxide semiconductor layer 114, the dielectric layer 116, the indium-containing features 120, and the source/drain contacts 122 described previously and are not repeated herein.

Figure 11:
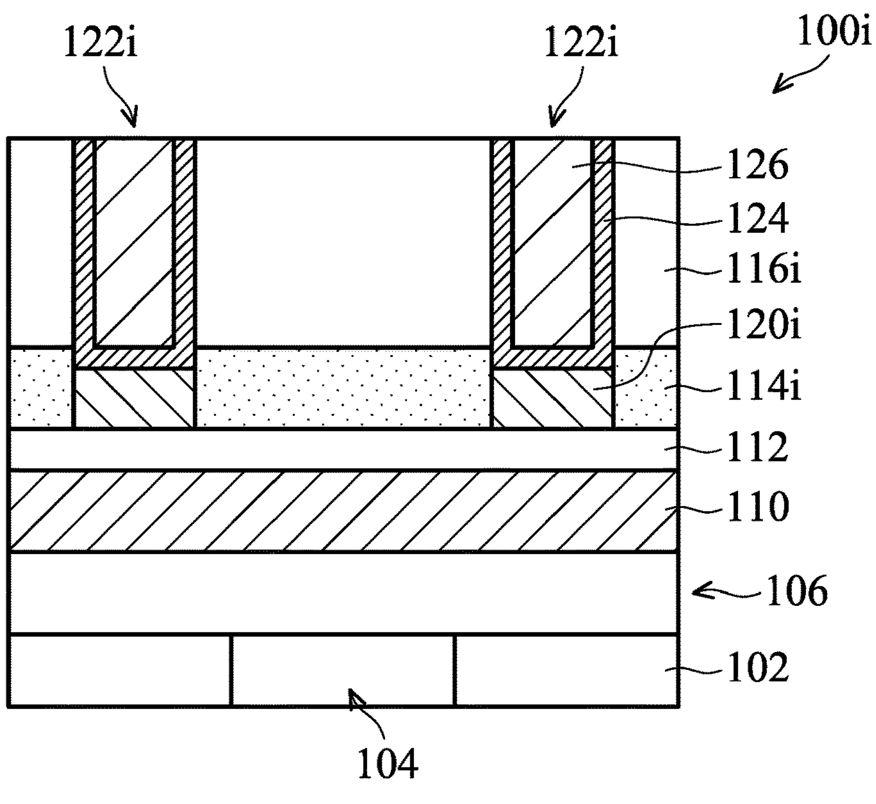
FIG. 11 illustrates a cross-sectional view of a semiconductor structure in accordance with some embodiments.

FIG. 11 illustrates a cross-sectional view of a semiconductor structure 100*i* in accordance with some embodiments. The semiconductor structure 100*i* may be similar to the semiconductor structure 100*h* shown in FIG. 10B, except its source/drain contacts also extend into its oxide semiconductor layer in accordance with some embodiments. Materials and processes for manufacturing the semiconductor structure 100*i* may be similar to, or the same as, those for manufacturing the semiconductor structures 100 and 100*a* to 100*h* described above and are not repeated herein.

More specifically, processes shown in FIGS. 2A to 2C and described previously are performed to form the substrate 102 having the device region 104, the interconnect structure 106, the bottom electrode layer 110, the gate dielectric layer 112, an oxide semiconductor layer 114*i*, and a dielectric layer 116*i* in accordance with some embodiments. Next, trenches, similar to the trenches 118*h*, are formed through both the dielectric layer 116*i* and the oxide semiconductor layer 114*i* in accordance with some embodiments. Afterwards, processes shown in FIGS. 2E and 2F are performed to form indium-containing features 120*i* and source/drain contacts 122*i*, as shown in FIG. 11 in accordance with some embodiments.

In some embodiments, the bottom surface of the indium-containing features 120*i* are in direct contact with the top surface of the gate dielectric layer 112. In some embodiments, the indium-containing features 120*i* are completely embedded in the oxide semiconductor layer 114*i*. In some embodiments, the top surface of the indium-containing feature 120*i* is lower than the top surface of the oxide semiconductor layer 114*i*. In addition, the bottom portions of the source/drain contacts 122*i* also extend into the oxide semiconductor layer 114*i* in accordance with some embodiments. In some embodiments, the interface between the indium-containing feature 120*i* and the source/drain contact 122*i* is lower than the top surface of the oxide semiconductor layer 114*i*.

The processes and materials for forming the oxide semiconductor layer 114*i*, the dielectric layer 116*i*, the indium-containing features 120*i*, and the source/drain contacts 122*i* are the same as those for forming the oxide semiconductor layer 114, the dielectric layer 116, the indium-containing features 120, and the source/drain contacts 122 described previously and are not repeated herein.

Figure 12:
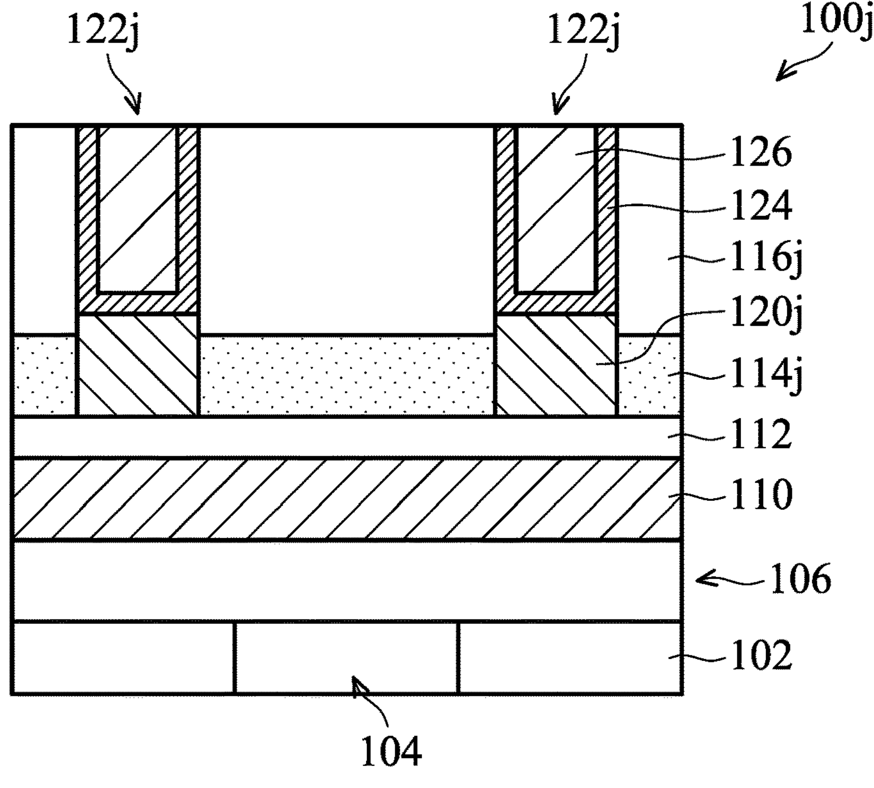
FIG. 12 illustrates a cross-sectional view of a semiconductor structure in accordance with some embodiments.

FIG. 12 illustrates a cross-sectional view of a semiconductor structure 100*j* in accordance with some embodiments. The semiconductor structure 100*j* may be similar to the semiconductor structure 100*h* shown in FIG. 10B, except its indium-containing features only partially embedded in its oxide semiconductor layer in accordance with some embodiments. Materials and processes for manufacturing the semiconductor structure 100*j* may be similar to, or the same as, those for manufacturing the semiconductor structures 100 and 100*a* to 100*i* described above and are not repeated herein.

More specifically, processes shown in FIGS. 2A to 2C and described previously are performed to form the substrate 102 having the device region 104, the interconnect structure 106, the bottom electrode layer 110, the gate dielectric layer 112, an oxide semiconductor layer 114*j*, and a dielectric layer 116*j* in accordance with some embodiments. Next, trenches, similar to the trenches 118*h*, are formed through the dielectric layer 116*j* and the oxide semiconductor layer 114*j* in accordance with some embodiments. Afterwards, processes shown in FIGS. 2E and 2F are performed to form indium-containing features 120*j* and source/drain contacts 122*j*, as shown in FIG. 12 in accordance with some embodiments.

In some embodiments, the bottom portions of the indium-containing features 120*j* are embedded in the oxide semiconductor layer 114*j* while the top portions of the indium-containing features 120*j* are protruding from the oxide semiconductor layer 114*j*. In some embodiments, the top surface of the indium-containing feature 120*j* is higher than the top surface of the oxide semiconductor layer 114*j* and the bottom surface of the indium-containing feature 120*j* is substantially level with the top surface of the gate dielectric layer 112. In some embodiments, the upper portion of the sidewall of the indium-containing feature 120*j* is covered by the dielectric layer 116*j* and the bottom portion of the sidewall of the indium-containing feature 120*j* is covered by the oxide semiconductor layer 114*j*. In addition, the bottom surfaces of the indium-containing features 120*j* are in direct contact with the top surface of the gate dielectric layer 112. In some embodiments, the interface between the indium-containing feature 120*j* and the source/drain contact 122*j* is higher than the top surface of the oxide semiconductor layer 114*j*.

The processes and materials for forming the oxide semiconductor layer 114*j*, the dielectric layer 116*j*, the indium-containing features 120*j*, and the source/drain contacts 122*j* are the same as those for forming the oxide semiconductor layer 114, the dielectric layer 116, the indium-containing features 120, and the source/drain contacts 122 described previously and are not repeated herein.

Figure 13A:
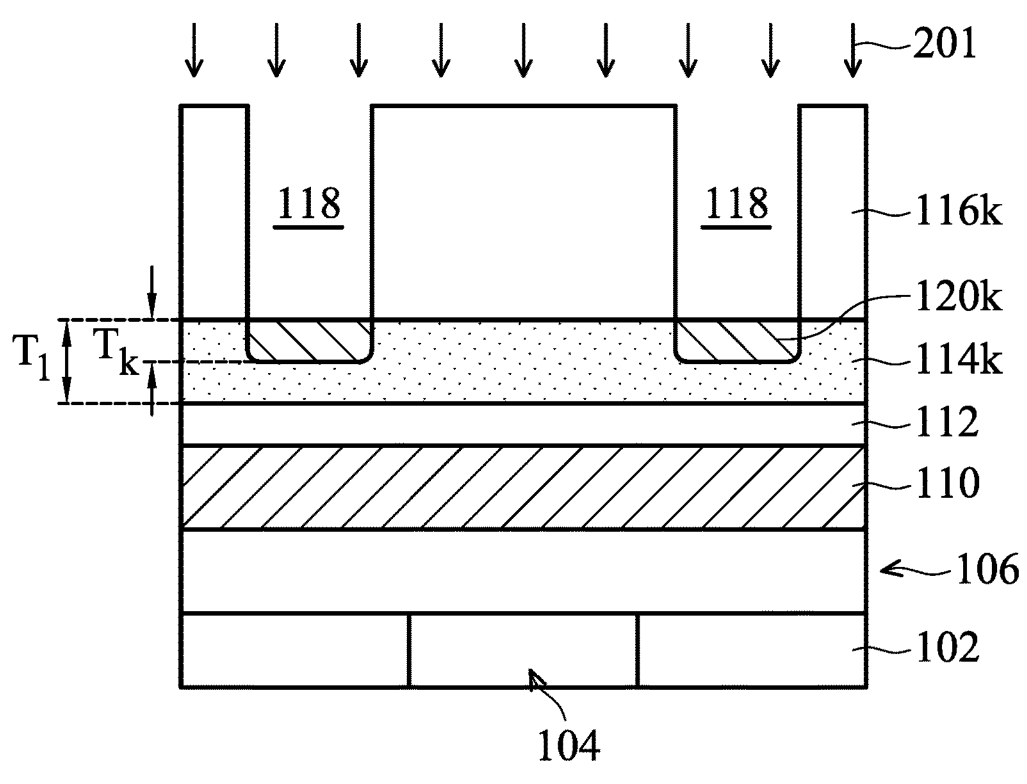
FIGS. 13A and 13B illustrate cross-sectional views of intermediate stages of manufacturing a semiconductor structure in accordance with some embodiments.
Figure 13B:
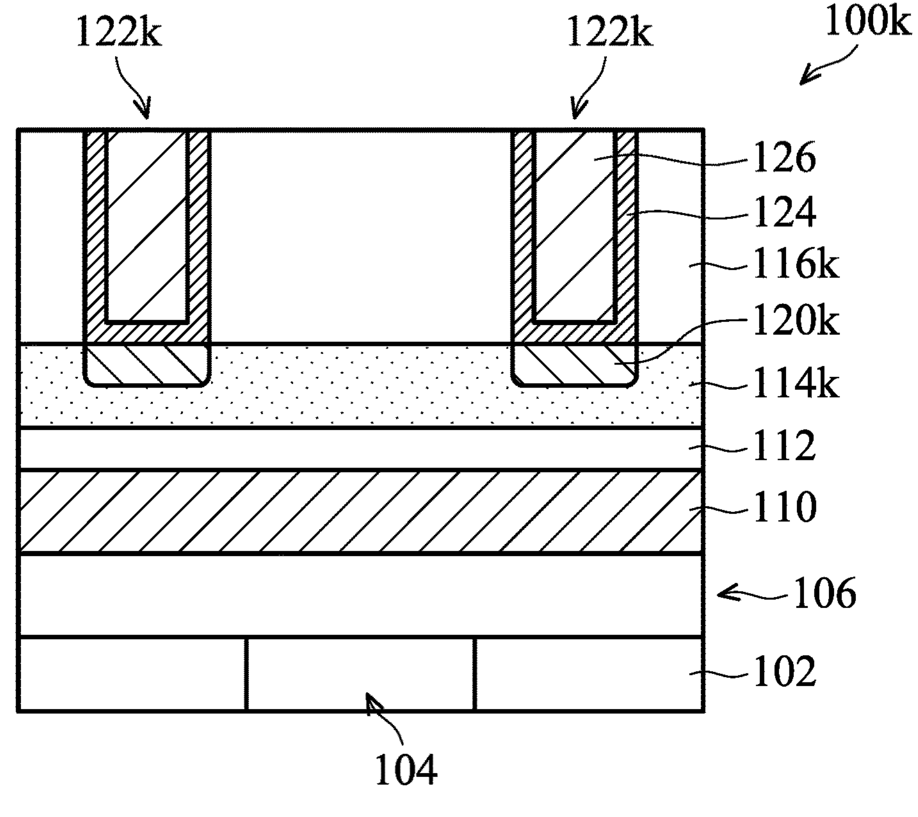

FIGS. 13A and 13B illustrate cross-sectional views of intermediate stages of manufacturing a semiconductor structure 100*k* in accordance with some embodiments. The semiconductor structure 100*k* may be similar to the semiconductor structure 100*e* shown in FIG. 7B, except its indium-containing features are formed by performing an implanting process in accordance with some embodiments. Materials and processes for manufacturing the semiconductor structure 100*k* may be similar to, or the same as, those for manufacturing the semiconductor structures 100 and 100*a* to 100*j* described above and are not repeated herein.

More specifically, processes shown in FIGS. 2A to 2D and described previously are performed to form the substrate 102 having the device region 104, the interconnect structure 106, the bottom electrode layer 110, the gate dielectric layer 112, an oxide semiconductor layer 114*k*, and a dielectric layer 116*k*, and the trenches 118 are formed through the dielectric layer 116*k* to expose the oxide semiconductor layer 114*k*, as shown in FIG. 13A in accordance with some embodiments.

After the trenches 118*e* are formed, an implanting process 201 is performed to form indium-containing features 120*k* in the oxide semiconductor layer 114*k*, as shown in FIG. 13A in accordance with some embodiments. In some embodiments, the implanting process 201 includes implanting indium dopants in the oxide semiconductor layer 114*k*. In some embodiments, the original oxide semiconductor layer 114*k* also include indium, and the ratio of the indium concentration in the indium-containing features 120*k* to the indium concentration in the oxide semiconductor layer 114*k* is in a range from about 1 to about 10. As described previously, the indium-containing features 120*k* may help to reduce the resistance of the source/drain contacts formed over them. In some embodiments, the dielectric layer 160 also includes some dopants after the implanting process 201 is performed.

In some embodiments, the thickness T k of the indium-containing features 120*k* is in a range from about 3 nm to about 20 nm. In some embodiments, the ratio of the thickness Tk of the indium-containing feature 120*k* to the thickness $T_1$ of the oxide semiconductor layer 114*k* is greater than 0.1. In some embodiments, the ratio of the thickness Tk of the indium-containing feature 120*k* to the thickness $T_1$ of the oxide semiconductor layer 114*k* is in a range from about 0.1 to about 1.

After the implanting process 201 is performed, an annealing process may be performed. In some embodiments, the annealing process is performed under a temperature in a range from about 300° C. to about 500° C. In some embodiments, the annealing process is performed for about 0.5 min to about 30 min.

Afterwards, processes shown in FIG. 2F and described previously may be performed to form source/drain contacts 122*k* in the trenches 118, as shown in FIG. 13B in accordance with some embodiments. In some embodiments, the interface between the indium-containing feature 120*k* and the source/drain contact 122*k* is substantially level with the top surface of the oxide semiconductor layer 114*k*.

The processes and materials for forming the oxide semiconductor layer 114*k*, the dielectric layer 116*k*, and the source/drain contacts 122*k* are the same as those for forming the oxide semiconductor layer 114, the dielectric layer 116, and the source/drain contacts 122 described previously and are not repeated herein.

Figures 14, 15:
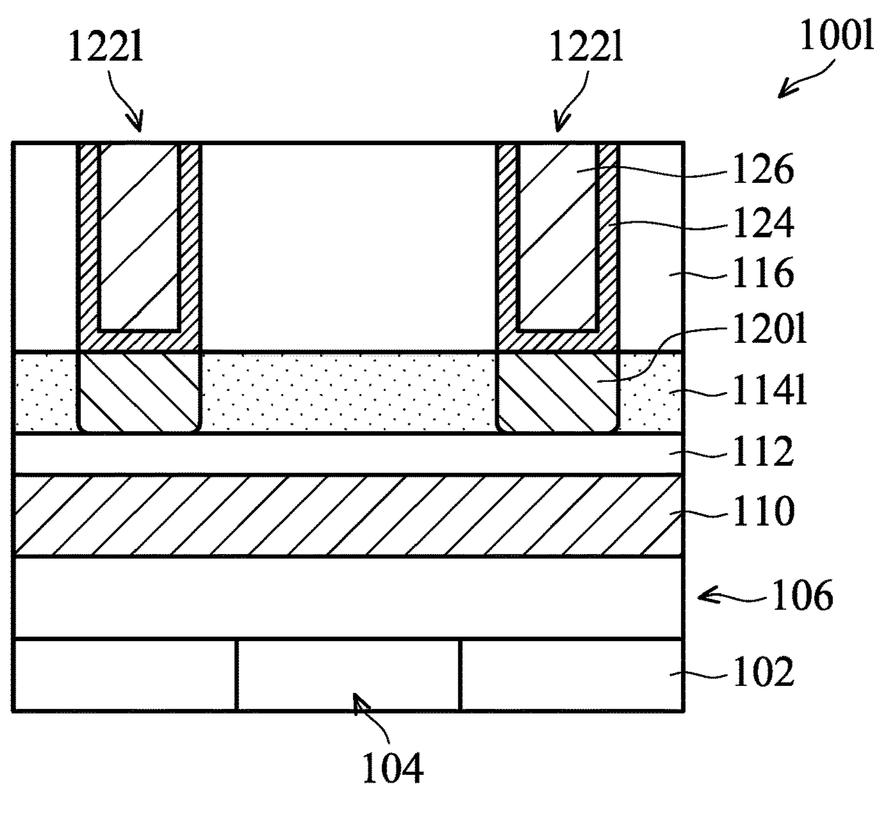
FIG. 14 illustrates a cross-sectional view of a semiconductor structure in accordance with some embodiments.
FIG. 15 illustrates a cross-sectional view of a semiconductor structure in accordance with some embodiments.

FIG. 14 illustrates a cross-sectional view of a semiconductor structure 100*l* in accordance with some embodiments. The semiconductor structure 100*l* may be similar to the semiconductor structure 100*k* shown in FIG. 13B, except its indium-containing features are thicker than that in the semiconductor structure 100*k* in accordance with some embodiments. Materials and processes for manufacturing the semiconductor structure 100*l* may be similar to, or the same as, those for manufacturing the semiconductor structures 100 and 100*a* to 100*k* described above and are not repeated herein.

More specifically, processes shown in FIGS. 2A to 2D and described previously are performed to form the substrate 102 having the device region 104, the interconnect structure 106, the bottom electrode layer 110, the gate dielectric layer 112, an oxide semiconductor layer 114*k*, the dielectric layer 116, and the trenches 118 in accordance with some embodiments. Afterwards, an implanting process is performed to form indium-containing features 120*l* in the oxide semiconductor layer 114*l* and source/drain contacts 122*l* are formed over the indium-containing features 120*l*, as shown in FIG. 14 in accordance with some embodiments.

The implanting process may be similar to the implanting process 201 shown in FIG. 13A and described previously, except the dopants are implanted into the bottom portion of the oxide semiconductor layer 114*l*, so that the bottom surface of the indium-containing features 120*l* are in contact with the gate dielectric layer 112 in accordance with some embodiments.

The processes and materials for forming the oxide semiconductor layer 114*l*, the indium-containing features 120*l*, and the source/drain contacts 122*l* are the same as those for forming the oxide semiconductor layer 114, the indium-containing features 120*k*, and the source/drain contacts 122 described previously and are not repeated herein.

FIG. 15 illustrates a cross-sectional view of a semiconductor structure 100*m* in accordance with some embodiments. The semiconductor structure 100*m* may be similar to the semiconductor structure 100 shown in FIG. 2F, except its indium-containing features surround the source/drain contacts in accordance with some embodiments. Materials and processes for manufacturing the semiconductor structure 100*m* may be similar to, or the same as, those for manufacturing the semiconductor structures 100 and 100*a* to 100*l* described above and are not repeated herein.

More specifically, processes shown in FIGS. 2A to 2D and described previously are performed to form the substrate 102 having the device region 104, the interconnect structure 106, the bottom electrode layer 110, the gate dielectric layer 112, an oxide semiconductor layer 114*k*, the dielectric layer 116, and the trenches in accordance with some embodiments. Afterwards, indium-containing features 120*m* are conformally formed to cover the bottom surface and the sidewalls of the trenches, and the source/drain contacts 122*m* are formed over the indium-containing features 120*m*, as shown in FIG. 15 in accordance with some embodiments.

Since the source/drain contacts 122*m* are surrounded by the indium-containing features 120*m*, the indium-containing features 120*m* may be used as the liners of the source/drain contacts 122*m*. That is, the liners 124 shown in FIG. 2F may be omitted and the conductive material layer (e.g. the conductive material layer 126) may be directly formed over the indium-containing features 120*m* as the source/drain contacts 122*m*.

In some embodiments, the indium-containing feature 120*m* has a thickness in a range from about 2 nm to about 20 nm. The indium-containing features 120*m* should not be too thick, so there will still be enough space for forming the source/drain contacts 122*m* over them. In some embodiments, the bottom surface of the indium-containing feature 120*m* is substantially level with the bottom surface of the dielectric layer 116. In some embodiments, the top surface of the indium-containing feature 120*m* is substantially level with the top surface of the dielectric layer 116 and the top surface of the source/drain contact 122*m*. The processes and materials for forming the indium-containing features 120*m* are the same as those for forming the indium-containing features 120 described previously and are not repeated herein.

Figure 16:
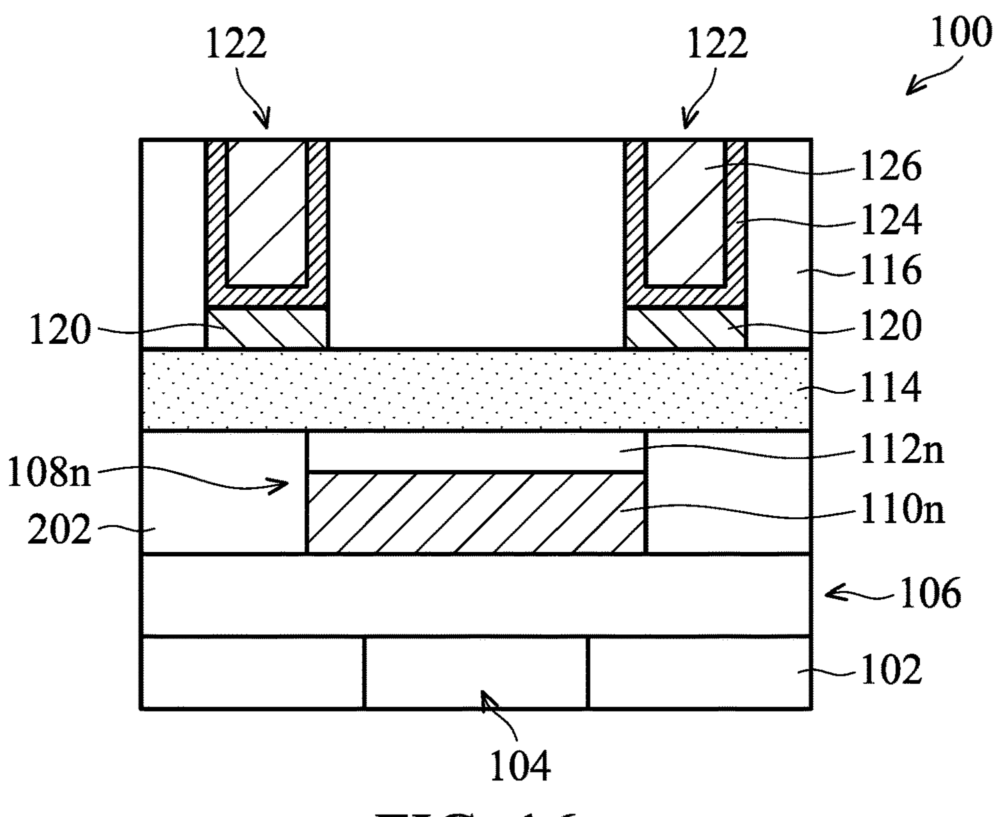
FIG. 16 illustrates a cross-sectional view of a semiconductor structure in accordance with some embodiments.

FIG. 16 illustrates a cross-sectional view of a semiconductor structure 100*n* in accordance with some embodiments. The semiconductor structure 100*n* may be similar to the semiconductor structure 100 shown in FIG. 2F, except its gate structure is narrower than the gate structure 108 shown in FIG. 2F in accordance with some embodiments. Materials and processes for manufacturing the semiconductor structure 100*n* may be similar to, or the same as, those for manufacturing the semiconductor structure 100 described above and are not repeated herein.

More specifically, after the interconnect structure 106 is formed, an inter-metal dielectric layer 202 is formed over the interconnect structure 106, and a gate structure 108*n* is embedded in the inter-metal dielectric layer 202, as shown in FIG. 16 in accordance with some embodiments. In some embodiments, the gate structure 108*n* partially overlaps the source/drain contacts 122 and the indium-containing features 120.

The inter-metal dielectric layer 202 may be formed over the interconnect structure 106 and may be made of any applicable dielectric material, for example, a nitride such as silicon nitride; an oxide such as silicon oxide, phosphosilicate glass (PSG), borosilicate glass (BSG), boron-doped phosphosilicate glass (BPSG), or the like; or the like. The inter-metal dielectric layer 202 may be formed by any applicable deposition process, such as spin coating, physical vapor deposition (PVD), chemical vapor deposition (CVD), the like, or a combination thereof. In some embodiments, the inter-metal dielectric layer 202 may be a layer made of a low-k dielectric material having a k-value lower than about 3.0.

In some embodiments, the gate structure 108*n* includes a bottom electrode layer 110*n* and a gate dielectric layer 112*n*. In some embodiments, the bottom electrode layer 110*n* and the gate dielectric layer 112*n* are formed in different layers of the inter-metal dielectric layer 202. In some embodiments, the width of the gate structure 108*n*, including the bottom electrode layer 110*n* and the gate dielectric layer 112*n*, is wider than the distance between two adjacent source/drain contacts 122. The processes and materials for forming the bottom electrode layer 110*n* and the gate dielectric layer 112*n* are the same as those for forming the bottom electrode layer 110 and the gate dielectric layer 112 described previously and are not repeated herein.

Figure 17:
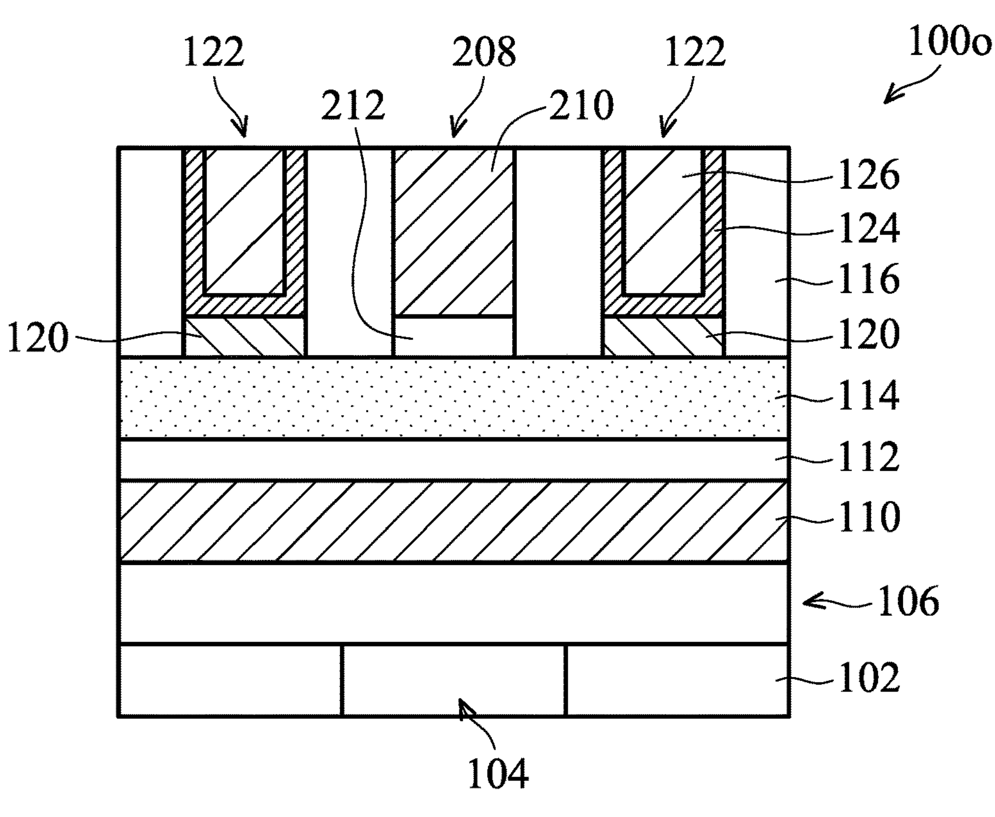
FIG. 17 illustrates a cross-sectional view of a semiconductor structure in accordance with some embodiments.

FIG. 17 illustrates a cross-sectional view of a semiconductor structure 100*o* in accordance with some embodiments. The semiconductor structure 100*o* may be similar to the semiconductor structure 100 shown in FIG. 2F, except a top gate structure is formed in accordance with some embodiments. Materials and processes for manufacturing the semiconductor structure 100*o* may be similar to, or the same as, those for manufacturing the semiconductor structure 100 described above and are not repeated herein.

More specifically, a top gate structure 208 is formed through the dielectric layer 116, as shown in FIG. 17 in accordance with some embodiments. In some embodiments, the top gate structure 208 is formed between two source/drain contacts 122 and is in direct contact with the top surface of the oxide semiconductor layer 114.

In some embodiments, the top gate structure 208 includes a top electrode layer 210 and a gate dielectric layer 212. The processes and materials for forming the top electrode layer 210 and the gate dielectric layer 212 are the same as those for forming the bottom electrode layer 110 and the gate dielectric layer 112 described previously and are not repeated herein.

Figure 18:
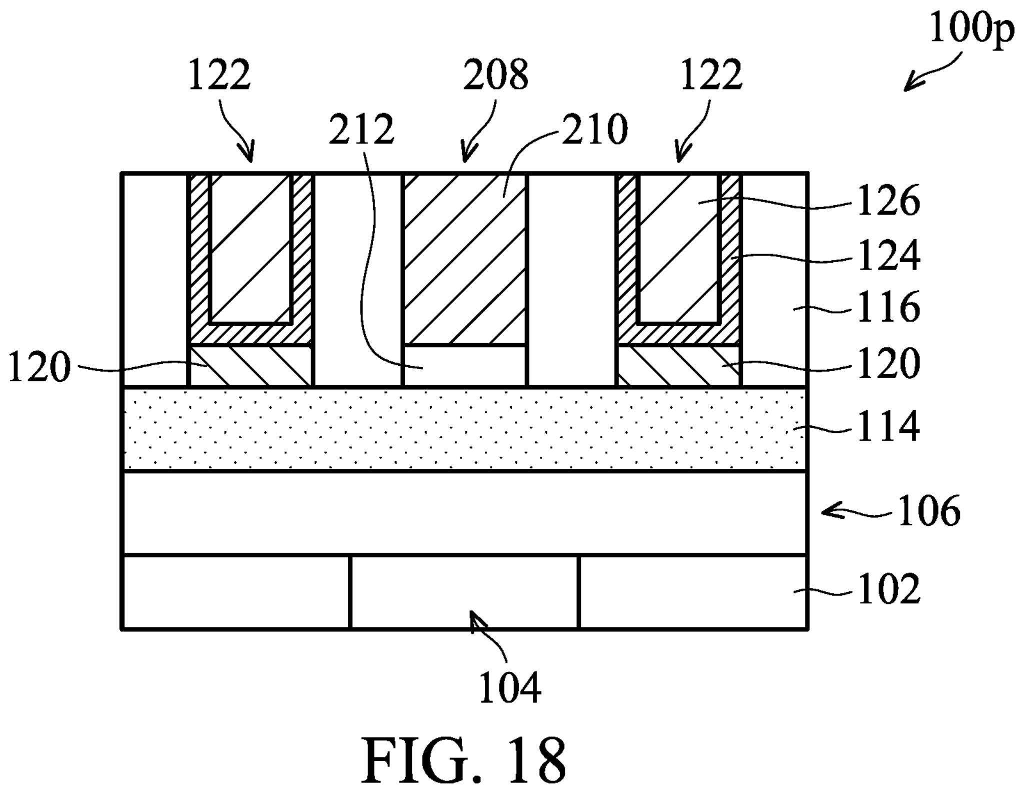
FIG. 18 illustrates a cross-sectional view of a semiconductor structure in accordance with some embodiments.

FIG. 18 illustrates a cross-sectional view of a semiconductor structure 100*p* in accordance with some embodiments. The semiconductor structure 100*p* may be similar to the semiconductor structure 100*o* shown in FIG. 17, except only top gate structure is formed in accordance with some embodiments. Materials and processes for manufacturing the semiconductor structure 100*p* may be similar to, or the same as, those for manufacturing the semiconductor structures 100 and 100*o* described above and are not repeated herein.

More specifically, the oxide semiconductor layer 114 is directly formed over the interconnect structure 106, and the top gate structure 208 is formed through the dielectric layer 116 over the oxide semiconductor layer 114, as shown in FIG. 18 in accordance with some embodiments.

It should be appreciated that the gate structures 108*n* and the top gate structure 208 shown in FIGS. 16 to 18 may also be applied to the semiconductor structures 100*a* to 100*m* described previously and the concept of the application is not intended to be limiting. For example, the gate structures 108 in the semiconductor structures 100*a* to 100*m* may be replaced by the gate structures 108*n* and/or the top gate structure 208.

Figure 19:
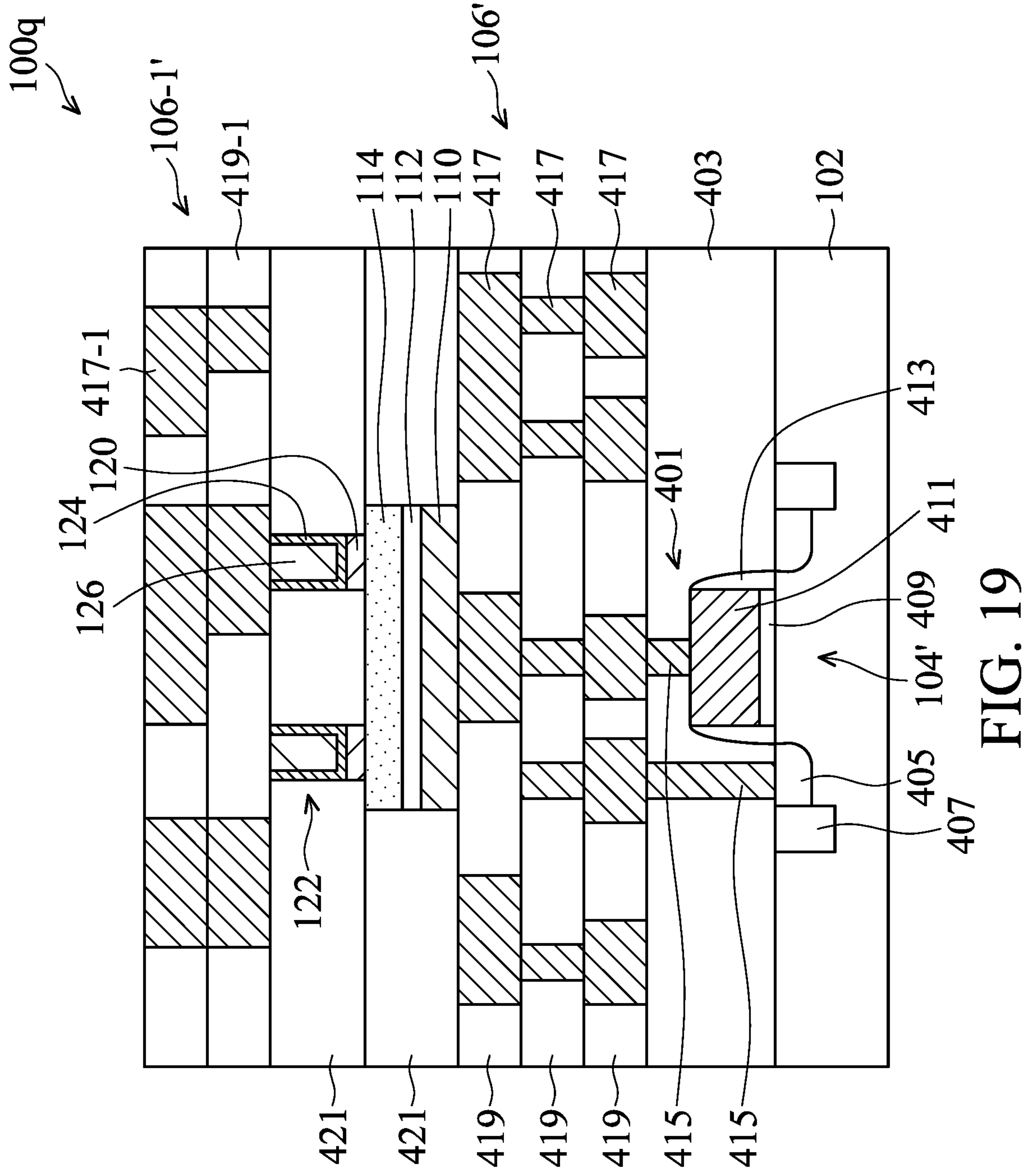
FIG. 19 illustrates a cross-sectional view of a semiconductor structure in accordance with some embodiments.

FIG. 19 illustrates a cross-sectional view of a semiconductor structure 100*q* in accordance with some embodiments. In some embodiments, the semiconductor structure 100*q* includes a device region 104' formed in the substrate 102, an interconnect structure 106' formed over the device region 104*q*, a thin film transistor structure formed over the interconnect structure 106', and another interconnect structure 106-1' formed over the thin film transistor structure.

In some embodiments, the device region 104' includes a gate structure 401 embedded in an interlayer dielectric (ILD) layer 403, source/drain regions 405, and isolation structures 407. In some embodiments, the gate structure 401 includes a gate dielectric layer 409, a gate electrode 411, and gate spacers 413.

In some embodiments, the gate dielectric layer 409 is made of high k dielectric materials, such as metal oxides, metal nitrides, metal silicates, transition metaloxides, transition metalnitrides, transition metalsilicates, oxynitrides of metals, or metal aluminates. Examples of the dielectric material may include, but are not limited to, hafnium oxide ($HfO_2$), hafnium silicon oxide (HfSiO), hafnium silicon oxynitride (HfSiON), hafnium tantalum oxide (HMO), hafnium titanium oxide (HfTiO), hafnium zirconium oxide (HfZrO), zirconium silicate, zirconium aluminate, silicon oxide, silicon nitride, silicon oxynitride, zirconium oxide, titanium oxide, aluminum oxide, or hafnium dioxide-alumina ($HfO_2$—$Al_2O_3$) alloy.

In some embodiments, the gate electrode 411 is made of a conductive material, such as aluminum, copper, tungsten, titanium, tantalum, titanium nitride, tantalum nitride, nickel silicide, cobalt silicide, TaC, TaSiN, TaCN, TiAl, TiAlN, or other applicable materials. In some embodiments, the gate spacers 413 are made of a dielectric material, such as silicon oxide ($SiO_2$), silicon nitride (SiN), silicon carbide (SiC), silicon oxynitride (SiON), silicon carbon nitride (SiCN), silicon oxide carbonitride (SiOCN), or a combination thereof.

The source/drain regions 405 may be formed in the substrate 102 using an epitaxial growth process, such as MBE, MOCVD, VPE, other applicable epitaxial growth process, or a combination thereof. In some embodiments, the source/drain regions 405 are made of any applicable material, such as Ge, Si, GaAs, AlGaAs, SiGe, GaAsP, SiP, SiC, SiCP, or a combination thereof. In some embodiments, the source/drain regions 405 are in-situ doped during the epitaxial growth process. For example, the source/drain regions 405 may be the epitaxially grown SiGe doped with boron (B). For example, the source/drain regions 405 may be the epitaxially grown Si doped with carbon to form silicon:carbon (Si:C) source/drain features, phosphorous to form silicon:phosphor (Si:P) source/drain features, or both carbon and phosphorous to form silicon carbon phosphor (SiCP) source/drain features. In some embodiments, the source/drain regions 405 are doped in one or more implantation processes after the epitaxial growth process.

The isolation structure 407 is configured to electrically isolate active regions of the substrate 102 and is also referred to as shallow trench isolation (STI) feature in accordance with some embodiments. The isolation structure 407 may be made of silicon oxide, silicon nitride, silicon oxynitride (SiON), another suitable insulating material, or a combination thereof. In some embodiments, a dielectric liner (not shown) is formed before the isolation structure 407 is formed, and the dielectric liner is made of silicon nitride and the isolation structure formed over the dielectric liner is made of silicon oxide.

The ILD layer 403 may include multilayers made of multiple dielectric materials, such as silicon oxide, silicon nitride, phosphosilicate glass (PSG), borophosphosilicate glass (BPSG), other low-k dielectric material, and/or other applicable dielectric materials. The ILD layer 403 may be formed by chemical vapor deposition (CVD), physical vapor deposition, (PVD), atomic layer deposition (ALD), spin-on coating, or other applicable processes.

Conductive structures 415 may be formed through the ILD layer 403 to connect with the gate structure 401 and the source/drain regions 405. In some embodiments, the conductive structures 415 are made of aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof.

Liners and/or barrier layers (not shown) may be formed surrounding the conductive structures 415. The liners may be made of silicon nitride, although any other applicable dielectric may be used as an alternative. The barrier layer may be made of tantalum nitride, although other materials, such as tantalum, titanium, titanium nitride, or the like, may also be used.

Next, the interconnect structure 106' is formed over the gate structure 401, as shown in FIG. 19 in accordance with some embodiments. In some embodiments, the interconnect structure 106' includes a numbers of metallization layers, and the metallization layers include conductive structures 417 formed in dielectric layers 419.

Next, the thin film transistor structure (e.g. the thin film transistor in the semiconductor structure 100 shown in FIG. 2F) is formed over the interconnect structure 106', as shown in FIG. 19 in accordance with some embodiments. In some embodiments, the thin film transistor includes the bottom electrode layer 110, the gate dielectric layer 112, the oxide semiconductor layer 114, the indium-containing features 120, and the source/drain contacts 122 embedded in dielectric layers 421.

After the thin film transistor structure is formed, the interconnect structure 106-1' is formed, so that the thin film transistor is interposed between the interconnect structure 106' and 106-1', as shown in FIG. 19 in accordance with some embodiments. In some embodiments, the interconnect structure 106-1' includes a numbers of metallization layers, and the metallization layers include conductive structures 417-1 formed in dielectric layers 419-1.

In some embodiments, the conductive structures 417 and 417-1 are made of aluminum (Al), copper (Cu), tungsten (W), titanium (Ti), tantalum (Ta), titanium nitride (TiN), cobalt, tantalum nitride (TaN), nickel silicide (NiS), cobalt silicide (CoSi), copper silicide, tantalum carbide (TaC), tantalum silicide nitride (TaSiN), tantalum carbide nitride (TaCN), titanium aluminide (TiAl), titanium aluminum nitride (TiAlN), other applicable conductive materials, or a combination thereof. In some embodiments, the dielectric layers 419, 419-1, and 421 are made of silicon oxide, silicon nitride, phosphosilicate glass (PSG), borophosphosilicate glass (BPSG), other low-k dielectric material, and/or other applicable dielectric materials.

It should be appreciated that although the thin film transistor structure in the semiconductor structure 100 is shown in FIG. 19, the thin film transistor structures in the semiconductor structures 100*a* to 100*p* described previously may also be applied to the structure shown in FIG. 19, and the concept of the application is not intended to be limiting. In addition, the device region 104' shown in FIG. 19 is merely an example, and other devices may be additionally or alternatively formed in the semiconductor structure 100*q*. In addition, some dielectric layers and conductive features are omitted in FIG. 19 for clarity.

Figure 20:
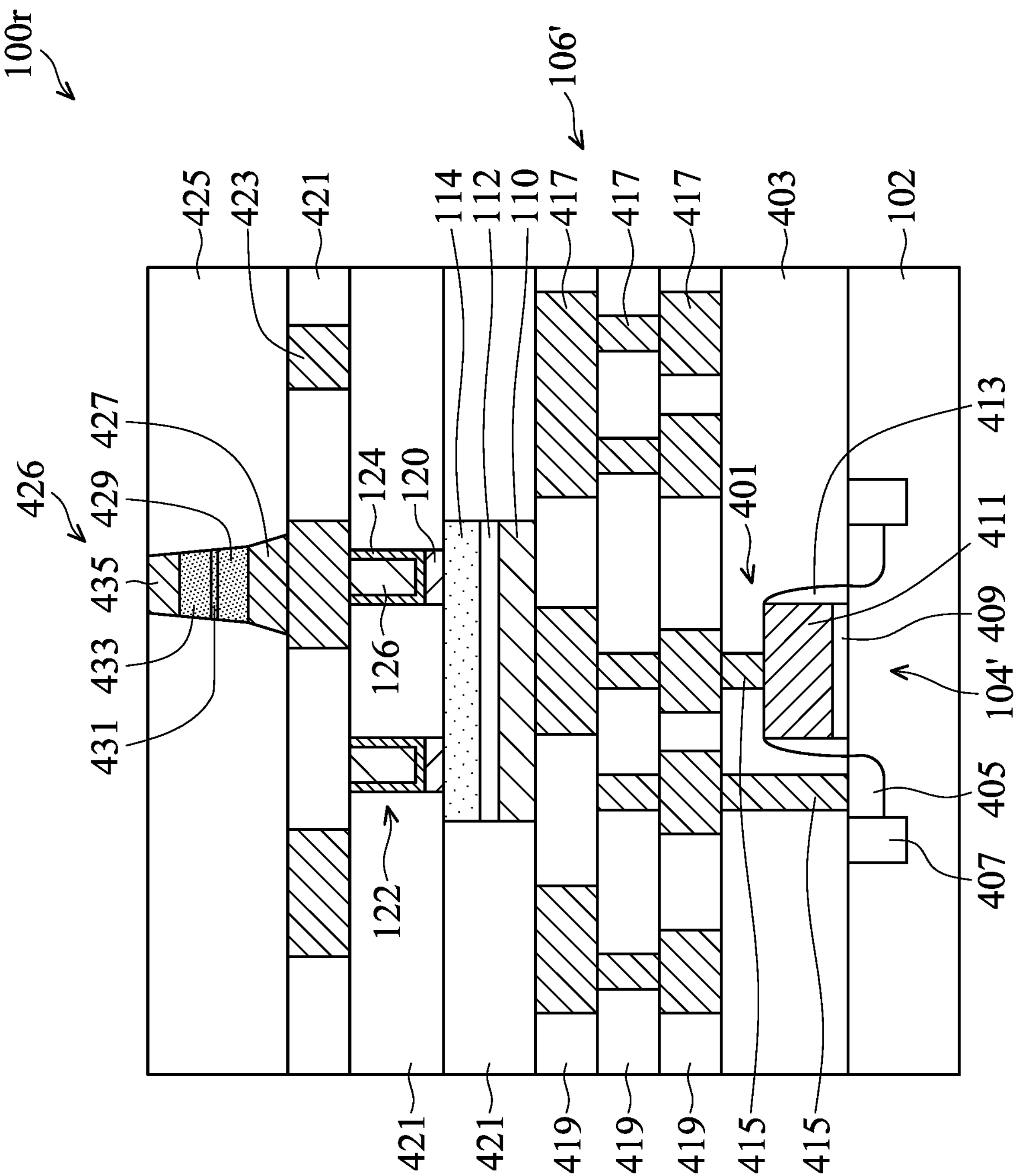
FIG. 20 illustrates a cross-sectional view of a semiconductor structure in accordance with some embodiments.

FIG. 20 illustrates a cross-sectional view of a semiconductor structure 100*r* in accordance with some embodiments. Semiconductor structure 100*r* is similar to semiconductor structure 100*q*, except a memory structure is formed over the thin film transistor structure. More specifically, a dielectric layer 421 is formed over the thin film transistor structure and conductive structures 423 are embedded in the dielectric layer 421 in accordance with some embodiments.

Afterwards, a memory structure 426 embedded in a dielectric layer 425 is formed over the dielectric layer 421 in accordance with some embodiments. In some embodiments, the memory structure 426 includes a bottom electrode structure 427, a pinned layer 429, a tunnel barrier layer 431, a free layer 433, and a top electrode structure 435.

In some embodiments, the bottom electrode structure 427 is made of conductive materials such as TaN, TiN, Ti/TiN, TaN/TiN, Ta, Cu, Al, Ti, W, Pt, Ni, Cr, Ru, combinations thereof, multilayers thereof, or the like. In some embodiments, the pinned layer 429 is made of a ferromagnetic material, such as cobalt iron (CoFe), cobalt iron boron (CoFeB), a combination thereof, or the like. In some embodiments, the tunnel barrier layer 431 is made of a dielectric material, such as MgO, AlO, AlN, a combination thereof, or the like. In some embodiments, the free layer 132 is made of a ferromagnetic material such as CoFe, NiFe, CoFeB, CoFeBW, a combination thereof, or the like. In some embodiments, the top electrode structure 435 is made of TiN, Ta, TaN, Ti, Ru, W, WC, Ru, Al, Cu, alloys thereof, or the like. Processes and materials for forming the dielectric layer 421 and the conductive structures 423 may be similar to, or the same as, those for forming the dielectric layer 419 and the conductive structure 417 and are not repeated herein.

It should be appreciated that although the thin film transistor structure in the semiconductor structure 100 is shown in FIG. 20, the thin film transistor structure in the semiconductor structures 100*a* to 100*p* described previously may also be applied to the structure shown in FIG. 20, and the concept of the application is not intended to be limiting. In addition, the device region 104' and the memory structure shown in FIG. are merely examples, and other devices/memory structures may be additionally or alternatively formed in semiconductor structure 100*r*. In addition, some dielectric layers and conductive features are omitted in FIG. 20 for clarity. Furthermore, in some embodiments, the memory structure is formed first, and the thin film transistor is formed over the memory structure (not shown).

Generally, thin film transistors are formed in a front-end-of-line (FEOL) structure over the substrate adjacent to the active devices. In some embodiments, the thin film transistor structures are formed in the back-end-of-line (BEOL) structure, so that the size of the FEOL structure may be reduced, and resulting device sizes may also be reduced (e.g. reduce 5% to 10% of the device size).

In addition, since the formation of the thin film transistors may be performed under relatively lower temperature, the manufacturing processes for forming the thin film transistors may be integrated into the BEOL manufacturing processes without undermining the function of the elements formed in the BEOL structure.

In some embodiments, the thin film transistors formed in the BEOL structure are used as power gates to switch off logic blocks in standby, thereby reducing static power consumption. In some embodiments, the thin film transistors formed in the BEOL structure are used as I/O devices which are the interface between a computing element (e.g. CPU) and the outside world (e.g. a hard drive). In some embodiments, the thin film transistors formed in the BEOL structure are used as selectors for a memory element such as an MRAM or RRAM.

In some embodiments, the indium-containing features (e.g. the indium-containing features 120 and 120*a* to 120*m*) are formed under the source/drain contacts (e.g. the source/drain contacts 122 and 122*a* to 122*m*), so the high Schottky barrier can be reduced and the contact resistance may therefore be reduced. Furthermore, the indium-containing features have the propensity to absorb hydrogen from adjacent layers, and this may help to achieve further lowering of the Schottky barrier. Since the contact resistance can be reduced, the resulting devices may have higher currents and improved performance.

It should be noted that same elements in FIGS. 1 to 20 may be designated by the same numerals and may include similar or the same materials and may be formed by similar or the same processes; therefore such redundant details are omitted in the interest of brevity. In addition, although the structures shown in FIGS. 1 to 20 are described in relation to specific methods, it will be appreciated that the structures disclosed in FIGS. 1 to 20 are not limited to the method but may stand alone as structures independent of the methods. Similarly, the methods shown in FIGS. 1 to 20 are not limited to the disclosed structures but may stand alone independent of the structures.

Also, while disclosed methods are illustrated and described below as a series of acts or events, it will be appreciated that the illustrated ordering of such acts or events may be altered in some other embodiments. For example, some acts may occur in different orders and/or concurrently with other acts or events apart from those illustrated and/or described above. In addition, not all illustrated acts may be required to implement one or more aspects or embodiments of the description above. Further, one or more of the acts depicted above may be carried out in one or more separate acts and/or phases.

Furthermore, the terms "approximately," "substantially," "substantial" and "about" describe above account for small variations and may be varied in different technologies and be in the deviation range understood by the skilled in the art. For example, when used in conjunction with an event or circumstance, the terms can refer to instances in which the event or circumstance occurs precisely as well as instances in which the event or circumstance occurs to a close approximation.

Embodiments for forming semiconductor structures may be provided. The semiconductor structure may include an interconnect structure, an electrode layer formed over the interconnect structure, a gate dielectric layer formed over the electrode layer, an oxide semiconductor layer formed over the gate dielectric layer. In addition, indium-containing features may be formed over the oxide semiconductor layer, and source/drain contacts are formed over the indium-containing features. Since the source/drain contacts are connected to the oxide semiconductor layer through the indium-containing features, the contact resistance may be reduced and the performance of the resulting semiconductor structure may be improved.

In some embodiments, a semiconductor structure is provided. The semiconductor structure includes an interconnect structure and an electrode layer formed over the interconnect structure. The semiconductor structure also includes a gate dielectric layer formed over the electrode layer and an oxide semiconductor layer formed over the gate dielectric layer. The semiconductor structure also includes an indium-containing feature covering a surface of the oxide semiconductor layer and a source/drain contact formed over the indium-containing feature.

In some embodiments, a semiconductor structure is provided. The semiconductor structure includes an interconnect structure and a gate structure formed over the interconnect structure. The semiconductor structure also includes an oxide semiconductor layer in contact with the gate structure and an indium-containing feature in direct contact with the oxide semiconductor layer. The semiconductor structure also includes a source/drain contact connecting to the oxide semiconductor layer through the indium-rich feature.

In some embodiments, a method for manufacturing a semiconductor structure is provided. The method for manufacturing the semiconductor structure includes forming an interconnect structure over a substrate and forming a gate dielectric layer over the interconnect structure. The method for manufacturing the semiconductor structure also includes forming an oxide semiconductor layer over the gate dielectric layer and forming an indium-containing feature in direct contact with the oxide semiconductor layer. The method for manufacturing the semiconductor structure also includes forming a dielectric layer covering the oxide semiconductor layer and forming a source/drain contact through the dielectric layer. In addition, the source/drain contact is in direct contact with a top surface of the indium-containing feature.

In some embodiments, a method for manufacturing a semiconductor structure is provided. The method for manufacturing the semiconductor structure includes forming a bottom electrode layer over a substrate and forming a gate dielectric layer over the bottom electrode layer. The method for manufacturing the semiconductor structure also includes forming an active layer over the gate dielectric layer and forming an indium-containing feature vertically overlapping the bottom electrode layer. The method for manufacturing the semiconductor structure also includes forming a source/drain contact landing on the indium-containing feature.

In some embodiments, a method for manufacturing a semiconductor structure is provided. The method for manufacturing the semiconductor structure includes forming an interconnect structure over a substrate and forming an active layer the interconnect structure. The method for manufacturing the semiconductor structure also includes forming an indium-containing feature in direct contact with the active layer, and a width of the indium-containing feature is smaller than a width of the active layer in a first direction. The method for manufacturing the semiconductor structure also includes forming a source/drain contact over the indium-containing feature. In addition, a width of the indium-containing feature is no smaller than a width of the source/drain contact in the first direction.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

forming a bottom electrode layer over a substrate;

forming a gate dielectric layer over the bottom electrode layer;

forming an active layer over the gate dielectric layer;

forming an indium-containing feature vertically overlapping the bottom electrode layer; and forming a source/drain contact landing on the indium-containing feature, wherein the source/drain contact comprises a hydrogen-absorbing layer and a contact material layer surrounded by the hydrogen-absorbing layer, and a portion of the hydrogen-absorbing layer vertically sandwiched between the contact material layer and the indium-containing feature and interfacing the indium-containing feature, wherein four sidewalls of the source/drain contact are surrounded by the active layer in a top view.

2. The method for manufacturing the semiconductor structure as claimed in claim 1, further comprising:

forming a dielectric layer over the active layer; and patterning the dielectric layer to form a trench partially exposing the active layer, wherein the indium-containing feature is formed in a bottom portion of the trench.

3. The method for manufacturing the semiconductor structure as claimed in claim 2, wherein the trench comprises an extending portion at least partially extends into the active layer, and the extending portion of the trench is no wider than a width of a top portion of the trench.

4. The method for manufacturing the semiconductor structure as claimed in claim 3, wherein a top surface of the indium-containing feature is higher than a top surface of the active layer.

5. The method for manufacturing the semiconductor structure as claimed in claim 4, wherein a bottom surface of the indium-containing feature is higher than a bottom surface of the active layer.

6. The method for manufacturing the semiconductor structure as claimed in claim 3, wherein a top surface of the indium-containing feature is no higher than a top surface of the active layer.

7. The method for manufacturing the semiconductor structure as claimed in claim 1, wherein forming the indium-containing feature comprises implanting indium dopants in the active layer.

8. The method for manufacturing the semiconductor structure as claimed in claim 1, wherein there is an interface between the hydrogen-absorbing layer and the indium-containing feature.

9. The method for manufacturing the semiconductor structure as claimed in claim 1, wherein the active layer has a first projection area in a top view, the source/drain contact has a second projection area in the top view, and the second projection area is completely inside the first projection area in the top view.

10. The method for manufacturing the semiconductor structure as claimed in claim 1, wherein the four sidewalls of the source/drain contact are spaced apart from four sidewalls of the active layer in the top view.

11. A method for manufacturing a semiconductor structure, comprising:

forming an interconnect structure over a substrate;

forming a bottom electrode layer over the interconnect structure;

forming an active layer over the bottom electrode layer;

forming a first indium-containing feature and a second indium-containing feature in direct contact with the active layer, wherein a width of the first indium-containing feature is smaller than a width of the active layer in a first direction; and forming a first source/drain contact over the first indium-containing feature and a second source/drain contact over the second indium-containing feature, wherein the first source/drain contact comprises:

a first sidewall; and a second sidewall opposite to the first sidewall and facing the second source/drain contact in a cross-sectional view, and wherein the second source/drain contact comprises:

a third sidewall; and a fourth sidewall opposite to the third sidewall and facing the first source/drain contact in the cross-sectional view, wherein a width of the first indium-containing feature is no smaller than a width of the first source/drain contact in the first direction, and wherein the bottom electrode layer continuously extends under the first source/drain contact and the second source/drain contact and laterally protrudes outside the first sidewall and the second sidewall of the first source/drain contact and the third sidewall and the fourth sidewall of the second source/drain contact in the cross-sectional view.

12. The method for manufacturing the semiconductor structure as claimed in claim 11, further comprising:

forming an indium-containing layer over the active layer; and pattering the indium-containing layer to form the first indium-containing feature and the second indium-containing feature.

13. The method for manufacturing the semiconductor structure as claimed in claim 12, wherein the width of the first indium-containing feature is greater than the width of the first source/drain contact in the first direction.

14. The method for manufacturing the semiconductor structure as claimed in claim 11, further comprising:

forming a dielectric layer covering the first indium-containing feature; and patterning the dielectric layer to expose the first indium-containing feature.

15. The method for manufacturing the semiconductor structure as claimed in claim 14, wherein a first portion of a top surface of the first indium-containing feature is covered by the dielectric layer and a second portion of the top surface of the first indium-containing feature is covered by the first source/drain contact.

16. The method for manufacturing the semiconductor structure as claimed in claim 11, further comprising:

forming a dielectric layer over the active layer, wherein the first source/drain contact is formed through the dielectric layer; and forming a top gate structure through the dielectric layer over the active layer.

17. The method for manufacturing the semiconductor structure as claimed in claim 11, wherein a first edge of the first source/drain contact and a second edge of the second source/drain contact are inside a projection area of the active layer without overlapping an edge of the active layer in a top view.

18. A method for manufacturing a semiconductor structure, comprising:

forming an interconnect structure over a substrate;

forming a gate dielectric layer over the interconnect structure;

forming an oxide semiconductor layer over the gate dielectric layer;

forming a dielectric layer covering the oxide semiconductor layer;

forming a trench that extends through the dielectric layer and into the oxide semiconductor layer to a first level, wherein the trench has a first sidewall that continuously and smoothly extends from a top surface of the dielectric layer to the first level, and the first level is lower than a top surface of the oxide semiconductor layer;

forming an indium-containing feature in a bottom portion of the trench, wherein the indium-containing feature covers a lower portion of the first sidewall of the trench; and forming a source/drain contact over the indium-containing feature in the trench, wherein the source/drain contact covers an upper portion of the first sidewall of the trench, and an interface between the source/drain contact and the dielectric layer is substantially aligned with an interface between the indium-containing feature and the oxide semiconductor layer, wherein the source/drain contact is in direct contact with a top surface of the indium-containing feature.

19. The method for manufacturing the semiconductor structure as claimed in claim 18, wherein the indium-containing feature is formed without vertically overlapping the dielectric layer.

20. The method for manufacturing the semiconductor structure as claimed in claim 18, wherein a top surface of the indium-containing feature is substantially level with a top surface of the oxide semiconductor layer.

* * * * *